US009019759B2

(12) United States Patent
Banna et al.

(10) Patent No.: US 9,019,759 B2
(45) Date of Patent: Apr. 28, 2015

(54) TECHNIQUES FOR PROVIDING A SEMICONDUCTOR MEMORY DEVICE

(71) Applicant: Micron Technology, Inc., Boise, ID (US)

(72) Inventors: Srinivasa R. Banna, San Jose, CA (US); Michael A. Van Buskirk, Saratoga, CA (US); Timothy Thurgate, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/043,833

(22) Filed: Oct. 1, 2013

(65) Prior Publication Data

US 2014/0029360 A1 Jan. 30, 2014

Related U.S. Application Data

(63) Continuation of application No. 13/047,097, filed on Mar. 14, 2011, now Pat. No. 8,547,738.

(60) Provisional application No. 61/313,986, filed on Mar. 15, 2010.

(51) Int. Cl.
*G11C 11/34* (2006.01)
*G11C 7/00* (2006.01)
*H01L 27/105* (2006.01)
(Continued)

(52) U.S. Cl.
CPC ............... *G11C 7/00* (2013.01); *H01L 27/105* (2013.01); *H01L 27/10802* (2013.01); *H01L 27/1203* (2013.01); *H01L 29/7841* (2013.01); *H01L 27/1052* (2013.01)

(58) Field of Classification Search
USPC .......................................... 365/174, 176, 178
See application file for complete search history.

(56) References Cited

U.S. PATENT DOCUMENTS 3,439,214 A  4/1969  Kabell
3,997,799 A  12/1976  Baker
(Continued)

FOREIGN PATENT DOCUMENTS

CA    272437 A    7/1927
CN    1366347 A   8/2002
(Continued)

OTHER PUBLICATIONS

Arimoto et al., A Configurable Enhanced T2RAM Macro for System-Level Power Management Unified Memory, 2006, VLSI Symposium, 2 pages.
(Continued)

*Primary Examiner* — Vu Le
(74) *Attorney, Agent, or Firm* — Wilmer Cutler Pickering Hale and Dorr LLP

(57) ABSTRACT

Techniques for providing a semiconductor memory device are disclosed. In one particular exemplary embodiment, the techniques may be realized as a semiconductor memory device including a plurality of memory cells arranged in an array of rows and columns. Each memory cell including a first region, a second region, and a body region capacitively coupled to at least one word line and disposed between the first region and the second region. Each memory cell also including a third region, wherein the third region may be doped differently than the first region, the second region, and the body region.

19 Claims, 11 Drawing Sheets

(51) Int. Cl.
*H01L 27/12* (2006.01)
*H01L 29/78* (2006.01)
*H01L 27/108* (2006.01)

(56) References Cited

U.S. PATENT DOCUMENTS

| | | | |
|---|---|---|---|
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa et al. |
| 5,355,330 A | 10/1994 | Hisamoto et al. |
| 5,388,068 A | 2/1995 | Ghoshal et al. |
| 5,397,726 A | 3/1995 | Bergemont |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,963,473 A | 10/1999 | Norman |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidaka et al. |
| 6,048,756 A | 4/2000 | Lee et al. |
| 6,081,443 A | 6/2000 | Morishita et al. |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,229,161 B1 | 5/2001 | Nemati et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes et al. |
| 6,538,916 B2 | 3/2003 | Ohsawa |
| 6,544,837 B1 | 4/2003 | Divakauni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Chang et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 * | 11/2004 | Ikehashi et al. ............... 257/314 |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,891,225 B2 | 5/2005 | Horiguchi et al. |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portman et al. |
| 6,913,964 B2 | 7/2005 | Hsu |

(56) References Cited

U.S. PATENT DOCUMENTS

| | | |
|---|---|---|
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi et al. |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller et al. |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,388,252 B2 * | 6/2008 | Lung .................. 257/315 |
| 7,416,943 B2 | 8/2008 | Figura et al. |
| 7,456,439 B1 | 11/2008 | Horch |
| 7,460,395 B1 | 12/2008 | Cho et al. |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,688,629 B2 | 3/2010 | Kim |
| 7,696,032 B2 | 4/2010 | Kim et al. |
| 8,315,099 B2 | 11/2012 | Van Buskirk et al. |
| 2001/0050406 A1 | 12/2001 | Akita et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee et al. |
| 2004/0029335 A1 | 2/2004 | Lee et al. |
| 2004/0075143 A1 | 4/2004 | Bae et al. |
| 2004/0108532 A1 | 6/2004 | Forbes |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0218449 A1 | 10/2005 | Inaba |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2006/0256606 A1 | 11/2006 | Park |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Deml et al. |
| 2008/0144378 A1 | 6/2008 | Park et al. |
| 2008/0165577 A1 | 7/2008 | Fazan et al. |
| 2008/0251830 A1 | 10/2008 | Higashi et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2009/0212362 A1 | 8/2009 | Cheng et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| CN | 1401140 A | 3/2003 |
| EP | 030856 A1 | 6/1981 |
| EP | 175378 A2 | 3/1986 |
| EP | 202515 A1 | 11/1986 |
| EP | 207619 A1 | 1/1987 |
| EP | 245515 A1 | 11/1987 |
| EP | 253631 A2 | 1/1988 |

(56) References Cited

FOREIGN PATENT DOCUMENTS

| | | |
|---|---|---|
| EP | 300157 A2 | 1/1989 |
| EP | 333426 A2 | 9/1989 |
| EP | 350057 A1 | 1/1990 |
| EP | 354348 A2 | 2/1990 |
| EP | 359551 A2 | 3/1990 |
| EP | 362961 A1 | 4/1990 |
| EP | 366882 A2 | 5/1990 |
| EP | 465961 A1 | 1/1992 |
| EP | 510607 A1 | 10/1992 |
| EP | 513923 A2 | 11/1992 |
| EP | 537677 A2 | 4/1993 |
| EP | 564204 A2 | 10/1993 |
| EP | 579566 A2 | 1/1994 |
| EP | 599388 A1 | 6/1994 |
| EP | 599506 A1 | 6/1994 |
| EP | 601590 A2 | 6/1994 |
| EP | 606758 A1 | 7/1994 |
| EP | 642173 A1 | 3/1995 |
| EP | 682370 A1 | 11/1995 |
| EP | 689252 A1 | 12/1995 |
| EP | 694977 A2 | 1/1996 |
| EP | 725402 A2 | 8/1996 |
| EP | 726601 A1 | 8/1996 |
| EP | 727820 A1 | 8/1996 |
| EP | 727822 A2 | 8/1996 |
| EP | 731972 A1 | 9/1996 |
| EP | 739097 A2 | 10/1996 |
| EP | 744772 A1 | 11/1996 |
| EP | 788165 A2 | 8/1997 |
| EP | 801427 A2 | 10/1997 |
| EP | 836194 A2 | 4/1998 |
| EP | 844671 A1 | 5/1998 |
| EP | 858109 A2 | 8/1998 |
| EP | 860878 A2 | 8/1998 |
| EP | 869511 A2 | 10/1998 |
| EP | 878804 A2 | 11/1998 |
| EP | 920059 A2 | 6/1999 |
| EP | 924766 A2 | 6/1999 |
| EP | 933820 A1 | 8/1999 |
| EP | 951072 A1 | 10/1999 |
| EP | 971360 A1 | 1/2000 |
| EP | 980101 A2 | 2/2000 |
| EP | 993037 A2 | 4/2000 |
| EP | 1073121 A2 | 1/2001 |
| EP | 1162663 A2 | 12/2001 |
| EP | 1162744 A1 | 12/2001 |
| EP | 1179850 A2 | 2/2002 |
| EP | 1180799 A2 | 2/2002 |
| EP | 1191596 A2 | 3/2002 |
| EP | 1204146 A1 | 5/2002 |
| EP | 1204147 A1 | 5/2002 |
| EP | 1209747 A2 | 5/2002 |
| EP | 1233454 A2 | 8/2002 |
| EP | 1237193 A2 | 9/2002 |
| EP | 1241708 A2 | 9/2002 |
| EP | 1253634 A2 | 10/2002 |
| EP | 1280205 A2 | 1/2003 |
| EP | 1288955 A2 | 3/2003 |
| FR | 2197494 A5 | 3/1974 |
| GB | 1414228 A | 11/1975 |
| JP | S62-007149 | 1/1987 |
| JP | 62-272561 A | 11/1987 |
| JP | 02-294076 A | 12/1990 |
| JP | 03-171768 A | 7/1991 |
| JP | H04-176163 U | 6/1992 |
| JP | 04-239177 A | 8/1992 |
| JP | 05-347419 A | 12/1993 |
| JP | 08-213624 A | 8/1996 |
| JP | 08-274277 A | 10/1996 |
| JP | H08-316337 | 11/1996 |
| JP | 09-046688 A | 2/1997 |
| JP | 09-082912 A | 3/1997 |
| JP | 10-242470 A | 9/1998 |
| JP | 11-087649 A | 3/1999 |
| JP | 12-247735 | 8/2000 |
| JP | 12-389106 A | 12/2000 |
| JP | 13-180633 A | 6/2001 |
| JP | 2002-009081 A | 1/2002 |
| JP | 2002-094027 A | 3/2002 |
| JP | 2002-176154 A | 6/2002 |
| JP | 2002-246571 A | 8/2002 |
| JP | 2002-329795 A | 11/2002 |
| JP | 2002-343886 A | 11/2002 |
| JP | 2002-353080 A | 12/2002 |
| JP | 2003-031693 A | 1/2003 |
| JP | 2003-68877 | 3/2003 |
| JP | 2003-086712 A | 3/2003 |
| JP | 2003-100641 A | 4/2003 |
| JP | 2003-100900 A | 4/2003 |
| JP | 2003-132682 A | 5/2003 |
| JP | 2003-203967 A | 7/2003 |
| JP | 2003-243528 A | 8/2003 |
| JP | 2004-335553 A | 11/2004 |
| WO | WO-01/24268 A1 | 4/2001 |
| WO | WO-2005/008778 A1 | 1/2005 |

OTHER PUBLICATIONS

Arimoto, A High-Density Scalable Twin Transistor RAM (TTRAM) With Verify Control for SOI Platform Memory IPs, Nov. 2007, IEEE J. Solid-State Circuits, vol. 22, No. 11, p. 2611-2619.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, p. 809-812.

Assaderaghi et al., "A Dynamic Threshold Voltage MOSFET (DTMOS) for Very Low Voltage Operation", IEEE Electron Device Letters, vol. 15, No. 12, Dec. 1994, p. 510-512.

Assaderaghi et al., "A Novel Silicon-On-Insulator (SOI) MOSFET for Ultra Low Voltage Operation", 1994 IEEE Symposium on Low Power Electronics, p. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, p. 414-422.

Assaderaghi et al., "High-Field Transport of Inversion-Layer Electrons and Holes Including Velocity Overshoot", IEEE Transactions on Electron Devices, vol. 44, No. 4, Apr. 1997, p. 664-671.

Avci, Floating Body Cell (FBC) Memory for 16-nm Technology with Low Variation on Thin Silicon and 10-nm BOX, Oct. 2008, SOI Conference, 2 pages.

Bae, Evaluation of 1T RAM using Various Operation Methods with SOONO (Silicon-On-Ono) device, Dec. 2008, IEDM, p. 805-808.

Ban et al., Integration of Back-Gate Doping for 15-nm Node Floating Body Cell (FBC) Memory, Components Research, Process Technology Modeling, presented in the 2010 VLSI Symposium on Jun. 17, 2010, 2 pages.

Ban, A Scaled Floating Body Cell (FBC) Memory with High-k+Metal Gate on Thin-Silicon and Thin-BOX for 16-nm Technology Node and Beyond, Jun. 2008, VLSI Symposium, p. 92-93.

Ban, Ibrahim, et al., "Floating Body Cell with Independently-Controlled Double Gates for High Density Memory," Electron Devices Meeting, 2006. IEDM '06. International, IEEE, p. 1-4, Dec. 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008, p. 795-798.

Blagojevic et al., Capacitorless 1T DRAM Sensing Scheme Automatice Reference Generation, IEEE J.Solid State Circuits, vol. 41, No. 6, pp. 1463-1470, 2006.

Blalock, T., "A High-Speed Clamped Bit-Line Current-Mode Sense Amplifier", IEEE Journal of Solid-State Circuits, vol. 26, No. 4, Apr. 1991, p. 542-548.

Butt, Scaling Limits of Double Gate and Surround Gate Z-RAM Cells, IEEE Trans. Elec. Dev., vol. 54, No. 9, p. 2255-2262, Sep. 2007.

Chan et al., "Effects of Floating Body on Double Polysilicon Partially Depleted SOI Nonvolatile Memory Cell", IEEE Electron Device Letters, vol. 24, No. 2, Feb. 2003, p. 75-77.

(56) References Cited

OTHER PUBLICATIONS

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009, p. 11.2.1-11.2.4.

Cho, A novel capacitor-less DRAM cell using Thin Capacitively-Coupled Thyristor (TCCT), 2005, IEDM, 4 pages.

Choi et al., Current Flow Mechanism in Schottky-Barrier MOSFET and Application to the 1T-DRAM, 2008, International Conference on SSDM, pp. 226-227.

Choi, High Speed Flash Memory and 1T-DRAM on Dopant Segregated Schottky Barrier (DSSB) FinFET SONOS Device for Multifunctional SoC Applications, Dec. 2008, IEDM, pp. 223-226.

Clarke, Junctionless Transistors Could Simply Chip Making, Say Researchers, EE Times, Feb. 2010, www.eetimes.com/showArticle.jhtml?articleID=223100050, 3 pages.

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, IEEE EDL, vol. 30, No. 12, pp. 1377-1379, Dec. 2009.

Collaert, Comparison of scaled floating body RAM architectures, Oct. 2008, SOI Conference, 2 pages.

Ershov, Optimization of Substrate Doping for Back-Gate Control in SOI T-RAM Memory Technology, 2005, SOI Conference, pp. 1-2.

Ertosun et al., A Highly Scalable Capacitorless Double Gate Quantum Well Single Transistor DRAM: 1T-QW DRAM, 2008, IEEE EDL, pp. 1-3.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE, 14 pages.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, et al., Soft Error Performance of Z-RAM Floating Body Memory, 2006, SOI Conference, Lausanne, Switzerland, 2 pages.

Fisch, et al., Customizing SOI Floating Body Memory Architecture for System Performance and Lower Cost, 2006, SAME Forum, Lausanne, Switzerland, 3 pages.

Fisch, Z-RAM® Ultra-Dense Memory for 90nm and Below, 2006, Hot Chips, 35 pages.

Fossum et al., New Insights on Capacitorless Floating Body DRAM Cells, IEEE EDL, vol. 28, No. 6, pp. 513-516, Jun. 2007.

Fujita, Array Architecture of Floating Body Cell (FBC) with Quasi-Shielded Open Bit Line Scheme for sub-40nm Node, 2008, SOI Conference, 2 pages.

Furuhashi, et al., Scaling Scenario of Floating Body Cell (FBC) Suppressing $V_{th}$ Variation Due to Random Dopant Fluctuation, Dec. 2008, SOI Conference, 2 pages.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFETs", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices, 4 pages.

Han et al., Bulk FinFET Unified-RAM (URAM) Cell for Multifunctioning NVM and Capacitorless 1T-DRAM, IEEE EDL, vol. 29, No. 6, pp. 632-634, Jun. 2008.

Han et al., Partially Depleted SONOS FinFET for Unified RAM (URAM) Unified Function for High-Speed 1T DRAM and Nonvolatile Memory, IEEE EDL, vol. 29, No. 7, pp. 781-783, Jul. 2008.

Han, Energy Band Engineered Unified-RAM (URAM) for Multi-Functioning 1T-DRAM and NVM, Dec. 2008, IEDM, pp. 227-230.

Han, Parasitic BJT Read Method for High-Performance Capacitorless 1T-DRAM Mode in Unified RAM, IEEE EDL, vol. 30, No. 10, pp. 1108-1110, Oct. 2009.

Hara, Y., "Toshiba's DRAM Cell Piggybacks on SOI Wafer", EE Times, Jun. 2003, 1 page.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI, 21 pages.

Jeong et al., "A Capacitor-less 1T DRAM Cell Based on a Surrounding Gate MOSFET with a Vertical Channel", Technology Development Team, Technology Development Team, Samsung Electronics Co., Ltd., pp. 92-93, May 2007.

Jeong et al., "A New Capacitorless 1T DRAM Cell: Surrounding Gate MOSFET with Vertical Channel (SGVC Cell)", IEEE Transactions on Nanotechnology, vol. 6, No. 3, May 2007, pp. 352-357.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-136.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub-100-nm Embedded and Stand-Alone Memory Applications, IEEE Trans. Elec. Dev., vol. 50, No. 12, pp. 2408-2416, Dec. 2003.

Kwon et al., "A Highly Scalable $4F^2$ DRAM Cell Utilizing a Doubly Gated Vertical Channel", Extended Abstracts of the 2009 International Conference on Solid State Devices and Materials, UC Berkley, p. 142-143, Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI FLASH Memory Cell", IEEE, Mar. 2000, pp. 12-15.

Liu et al., Surface Generation-Recombination Processes of Gate and STI Oxide Interfaces Responsible For Junction Leakage on SOI, Sep. 2009, ECS Transactions, vol. 25, 10 pages.

(56) References Cited

OTHER PUBLICATIONS

Liu, Surface Recombination-Generation Processes of Gate, STI and Buried Oxide Interfaces, Responsible for Junction Leakage on SOI, ICSI, May 19, 2009, 2 pages.

Loncar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.

Lu et al., A Novel Two- Transistor Floating Body/Gate Cell for Low Power Nanoscale Embedded DRAM, Jun. 2008, IEEE Trans. Elec. Dev., vol. 55, No. 6, pp. 1511-1518.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005 Symposium on VLSI Circuits Digest of Technical Papers, pp. 358-361.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of $6F^2$ Single Cell Operation in Multi Gbit Memories Confirmed by a Newly Developed Method for Measuring Signal Sense Margin, 2007, IEEE, pp. 39-42.

Minami, A Floating Body Cell (FBC) fully Compatible with 90nm CMOS Technology(CMOS IV) for 128Mb SOI DRAM, 2005, IEDM Tech. Digest, pp. 317-320 (4 pages).

Mohapatra et al., Effect of Source/Drain Asymmetry on the Performance of Z-RAM® Devices, Oct. 2009, SOI conference, 2 pages.

Morishita, A Capacitorless Twin-Transistor Random Access Memory (TTRAM) on SOI, 2005, CICC, 4 pages.

Morishita, F. et al., "A Configurable Enhanced TTRAM Macro for System-Level Power Management Unified Memory", IEEE Journal of Solid-State Circuits, vol. 42, No. 4, pp. 853-861, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic Floating Body Control SOI CMOS Circuits for Power Managed Multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying Of Hot Carrier Effect In Floating Body Soi Mosfets By The Transient Charge Pumping Technique, Switzerland 2003, 2 pages.

Nayfeh, A Leakage Current Model for SOI based Floating Body Memory that Includes the Poole-Frenkel Effect, 2008, SOI Conference, 2 pages.

Nemati, A Novel High Density, Low Voltage SRAM Cell with a Vertical NDR Device, 1998, VLSI Tech. Symp., 2 pages.

Nemati, A Novel Thyristor-based SRAM Cell (T-RAM) for High-Speed, Low-Voltage, Giga-scale Memories, 1999, IEDM Conference, 4 pages.

Nemati, Embedded Volatile Memories-Embedded Tutorial: The New Memory Revolution, New Drives Circuits and Systems, ICCAD 2008, Nov. 2008, San Jose, CA, 23 pages.

Nemati, Fully Planar 0.562μm² T-RAM Cell in a 130nm SOI CMOS Logic Technology for High-Density High-Performance SRAMs, 2004, IEDM, 4 pages.

Nemati, Thyristor RAM (T-RAM): A High-Speed High-Density Embedded Memory Technology for Nano-scale CMOS, 2007, Hot Chips Conference, Milpitas, CA, 24 pages.

Nemati, Thyristor-RAM: A Novel Embedded Memory Technology that Outperforms Embedded S RAM/DRAM, 2008, Linley Tech Tour, San Jose, CA, 11 pages.

Nishiguchi et al., Long Retention of Gain-Cell Dynamic Random Access Memory with Undoped Memory Node, IEEE EDL, vol. 28, No. 1, pp. 48-50, Jan. 2007.

Oh, Floating Body DRAM Characteristics of Silicon-On-ONO (SOONO) Devices for System-on-Chip (SoC) Applications, 2007, Symposium on VLSI Technology Digest of Technical Papers, pp. 168-169.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006), 2 pages.

Ohsawa, et al., An 18.5ns 128Mb SOI DRAM with a Floating Body Cell, 2005, ISSCC, pp. 458-459 & 609 (3 pages).

Ohsawa, Autonomous Refresh of Floating Body Cell (FBC), Dec. 2008, IEDM, pp. 801-804.

Ohsawa, Design of a 128-Mb SOI DRAM Using the Floating Body Cell (FBC), IEEE J. Solid-State Circuits, vol. 41, No. 1, Jan. 2006, pp. 135-145.

Okhonin, A Capacitor-Less 1T-DRAM Cell, IEEE Electron Device Letters, vol. 23, No. 2, Feb. 2002, pp. 85-87.

Okhonin, A SOI Capacitor-less 1T-DRAM Concept, pp. 153-154, 2001, SOI Conference.

Okhonin, et al., Charge Pumping Effects in Partially Depleted SOI MOSFETs, 2003, SOI Conference, 2 pages.

Okhonin, et al., New characterization techniques for SOI and related devices, 2003, ECCTD, 1 page.

Okhonin, et al., New Generation of Z-RAM, 2007, IEDM, Lausanne, Switzerland, 3 pages.

Okhonin, Principles of Transient Charge Pumping on Partially Depleted SOI MOSFETs, May 2002, IEEE Electron Device Letters, vol. 23, No. 5, pp. 279-281.

Okhonin, et al., Transient Charge Pumping for Partially and Fully Depleted SOI MOSFETs, 2002, SOI Conference, 2 pages.

Okhonin, Transient effects in PD SOI MOSFETs and potential DRAM applications, 2002, Solid-State Electronics, vol. 46, pp. 1709-1713.

Okhonin, et al., Ultra-scaled Z-RAM cell, 2008, SOI Conference, 2 pages.

Okhonin, Z-RAM® (Limits of DRAM), 2009, ESSDERC, Lausanne, Switzerland, 64 pages.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008, pp. 171-174.

Park, Fully Depleted Double-Gate 1T-DRAM Cell with NVM Function for High Performance and High Density Embedded DRAM, 2009, IMW, pp. 32-33.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using Gate-Induced Drain-Leakage (GIDL) Current for High Speed and Low Power applications, 2008, pp. 224-225, SSDM.

Puget et al., Quantum effects influence on thin silicon film capacitorless DRAM performance, 2006, SOI Conference, 2 pages.

Puget, FDSOI Floating Body Cell eDRAM Using Gate-Induced Drain-Leakage (GIDL) Write Current for High Speed and Low Power Applications, 2009, IMW, pp. 28-29.

Ranica et al., 1T-Bulk DRAM cell with improved performances: the way to scaling, 2005, ICMTD, 4 pages.

(56) References Cited

OTHER PUBLICATIONS

Ranica, et al., A capacitor-less DRAM cell on 75nm gate length, 16nm thin Fully Depleted SOI device for high density embedded memories, 2004, IEDM, 4 pages.
Ranica, A One Transistor Cell on Bulk Substrate (1T-Bulk) for Low-Cost and High Density eDRAM, 2004, Symposium on VLSI Technology Digest of Technical Papers, pp. 128-129 (2 pages).
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM: Novel Capacitor-less DRAM Memory, SOI Conference, 2009 IEEE International, Oct. 5-8, 2009 pp. 1-2.
Roy, et al., Thyristor-Based Volatile Memory in Nano-Scale CMOS, 2006, ISSCC, 10 pages.
Sailing et al., Reliability of Thyristor Based Memory Cells, 2009, IRPS, 7 pages.
Sasaki et al., Charge Pumping in SOS-MOS Transistors, IEEE Trans. Elec. Dev., vol. ED-28, No. 1, Jan. 1981, pp. 48-52.
Sasaki et al., Charge Pumping SOS-MOS Transistor Memory, 1978, IEDM, pp. 356-359 (4 pages and clear graph of Fig. 10).
Schloesser et al., "A $6F^2$ Buried Wordline DRAM Cell for 40nm and Beyond", IEEE, Qimonda Dresden GmbH & Co., pp. 809-812 (2008).
Shino et al., Floating Body RAM Technology and its Scalability to 32nm Node and Beyond, 2006, IEDM, 4 pages.
Shino et al., Operation Voltage Dependence of Memory Cell Characteristics in Fully Depleted Floating Body Cell, IEEE Trans. Elec. Dev., vol. 25, No. 10, Oct. 2005, pp. 2220-2226.
Shino, et al., Fully-Depleted FBC (Floating Body Cell) with Enlarged Signal Window and Excellent Logic Process Compatibility, 2004, IEDM, 4 pages.
Shino, et al. Highly Scalable FBC (Floating Body Cell) with 25nm BOX Structure for Embedded DRAM Applications, 2004, Symposium on VLSI Technology, pp. 132-133 (2 pages).
Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.
Singh, et al., A 2ns-Read-Latency 4Mb Embedded Floating-Body Memory Macro in 45nm SOI Technology, Feb. 2009, ISSCC, 3 pages.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, et al., 55 nm Capacitor-less 1T DRAM Cell Transistor with Non-Overlap Structure, Dec. 2008, IEDM, pp. 797-800.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).
Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.
Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.
Tack et al., "The Multistable Charge-Controlled Memory Effect in SOI MOS Transistors at Low Temperatures", IEEE Transactions on Electron Devices, vol. 37, No. 5, May 1990, pp. 1373-1382.
Tack, et al., "An Analytical Model for the Misis Structure in SOI MOS Devices", Solid-State Electronics vol. 33, No. 3, 1990, pp. 357-364.

Tanabe et al., A 30-ns. 64-MB DRAM with Built-in-Self-Test and Self-Repair Function, IEEE Journal of Solid State Circuits, vol. 27, No. 11, Nov. 1992, pp. 1525-1533.
Tanaka et al., "Scalability Study on a Capacitorless 1T-DRAM: From Single-gate PD-SOI to Double-gate Findram", 2004 IEEE, 4 pages.
Tang, et al., Highly Scalable Capacitorless DRAM Cell on Thin-Body with Band-gap Engineered Source and Drain, Extended Abstracts of the 2009 ICSSDM, Sendai, 2009, pp. 144-145.
Terauchi et al., "Analysis of Floating-Body-Induced Leakage Current in 0.15μ m SOI DRAM", Proceedings 1996 IEEE International SOI Conference, Oct. 1996, pp. 138-139.
Thomas et al., "An SOI 4 Transistors Self-Refresh Ultra-Low-Voltage Memory Cell", IEEE, Mar. 2003, pp. 401-404.
Tomishima, et al., "A Long Data Retention SOI DRAM with the Body Refresh Function", IEICE Trans. Electron., vol. E80-C, No. 7, Jul. 1997, pp. 899-904.
Tsaur et al., "Fully Isolated Lateral Bipolar-MOS Transistors Fabricated in Zone-Melting-Recrystallized Si Films on $SiO_2$ ", IEEE Electron Device Letters, vol. EDL-4, No. 8, Aug. 1983, pp. 269-271.
Tu, et al., "Simulation of Floating Body Effect in SOI Circuits Using BSIM3SOI", Proceedings of Technical Papers (IEEE Cat No. 97TH8303), Jun. 1997, pp. 339-342.
Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (2 pages).
Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).
Villaret et al., Further Insight into the Physics and Modeling of Floating Body Capacitorless DRAMs, IEEE Trans. Elec. Dev., vol. 52, No. 11, Nov. 2005, pp. 2447-2454.
Wang et al., A Novel $4.5F^2$ Capacitorless Semiconductor Memory Device, 2008, IEEE EDL, pp. 1-2.
Wann et al., "A Capacitorless DRAM Cell on SOI Substrate", IEEE IEDM, 1993, pp. 635-638.
Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.
Wei, A., "Measurement of Transient Effects in SOI DRAM/SRAM Access Transistors", IEEE Electron Device Letters, vol. 17, No. 5, May 1996, pp. 193-195.
Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.
Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.
Yamanaka et al., "Advanced TFT SRAM Cell Technology Using a Phase-Shift Lithography", IEEE Transactions on Electron Devices, vol. 42, No. 7, Jul. 1995, pp. 1305-1313.
Yamauchi et al., "High-Performance Embedded SOI DRAM Architecture for the Low-Power Supply", IEEE Journal of Solid-State Circuits, vol. 35, No. 8, Aug. 2000, pp. 1169-1178.
Yamawaki, M., "Embedded DRAM Process Technology", Proceedings of the Symposium on Semiconductors and Integrated Circuits Technology, 1998, vol. 55, pp. 38-43.
Yang, et al., Optimization of Nanoscale Thyristors on SOI for High-Performance High-Density Memories, 2006, SOI Conference, 2 pages.
Yoshida et al., "A Design of a Capacitorless 1-T-DRAM Cell Using Gate-induced Drain Leakage (GIDL) Current for Low-Power and High-speed Embedded Memory", 2003 IEEE, 4 pages.
Yoshida et al., "A Study of High Scalable DG-FinDRAM", IEEE Electron Device Letters, vol. 26, No. 9, Sep. 2005, pp. 655-657.
Yoshida et al., A Capacitorless 1T-DRAM Technology Using Gate-Induced Drain-Leakage (GIDL) Current for Low Power and High Speed Embedded Memory, IEEE Trans. Elec. Dev., vol. 53, No. 4, Apr. 2006, pp. 692-697.

(56) References Cited

OTHER PUBLICATIONS

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in Silicon-On-ONO (SOONO) Device for the Capacitor-less RAM Applications, 2007, SOI Conference, 2 pages.

Zhou, Physical Insights on BJT-Based 1T DRAM Cells, IEEE Electron Device Letters, vol. 30, No. 5, May 2009, pp. 565-567.

First Office Action Issued by State Intellectual Property Office mailed Sep. 22, 2014 for co-pending CN Application No. 201180013884.9 (6pgs.).

Supplementary European Search Report and Written Opinion issued by the European Patent Office for EP Application No. 11756798.2 mailed Aug. 4, 2014 (10 pgs.).

* cited by examiner

US 9,019,759 B2

TECHNIQUES FOR PROVIDING A SEMICONDUCTOR MEMORY DEVICE

CROSS-REFERENCE TO RELATED APPLICATIONS

This patent application is continuation patent application of U.S. patent application Ser. No. 13/047,097, filed Mar. 14, 2011, which claims priority to U.S. Provisional Patent Application No. 61/313,986, filed Mar. 15, 2010, each of which is hereby incorporated by reference in its entirety.

FIELD OF THE DISCLOSURE

The present disclosure relates generally to semiconductor memory devices and, more particularly, to techniques for providing a junction-less semiconductor memory device.

BACKGROUND OF THE DISCLOSURE

The semiconductor industry has experienced technological advances that have permitted increases in density and/or complexity of semiconductor memory devices. Also, the technological advances have allowed decreases in power consumption and package sizes of various types of semiconductor memory devices. There is a continuing trend to employ and/or fabricate advanced semiconductor memory devices using techniques, materials, and devices that improve performance, reduce leakage current, and enhance overall scaling. Silicon-on-insulator (SOI) and bulk substrates are examples of materials that may be used to fabricate such semiconductor memory devices. Such semiconductor memory devices may include, for example, partially depleted (PD) devices, fully depleted (FD) devices, multiple gate devices (e.g., double, triple gate, or surrounding gate), and Fin-FET devices.

A semiconductor memory device may include a memory cell having a memory transistor with an electrically floating body region wherein electrical charge may be stored. When excess majority electrical charges carriers are stored in the electrically floating body region, the memory cell may store a logic high (e.g., binary "1" data state). When the electrical floating body region is depleted of majority electrical charge carriers, the memory cell may store a logic low (e.g., binary "0" data state). Also, a semiconductor memory device may be fabricated on silicon-on-insulator (SOI) substrates or bulk substrates (e.g., enabling body isolation). For example, a semiconductor memory device may be fabricated as a three-dimensional (3-D) device (e.g., a multiple gate device, a Fin-FET device, and a vertical pillar device).

In one conventional technique, the memory cell of the semiconductor memory device may be manufactured by an implantation process. During a conventional implantation process, defect structures may be produced in a silicon lattice of various regions of the memory cell of the semiconductor memory device. The defect structures formed during the implantation process may decrease retention time of majority charge carriers stored in the memory cell of the semiconductor memory device. Also, during a conventional implantation process, various regions of the memory cell may be doped with undesired doping concentrations. The undesired doping concentrations may thus produce undesired electrical properties for the memory cell of the semiconductor memory device. Further, the conventional implantation process may face lateral and vertical scaling challenges.

In view of the foregoing, it may be understood that there may be significant problems and shortcomings associated with conventional techniques for providing a semiconductor memory device.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
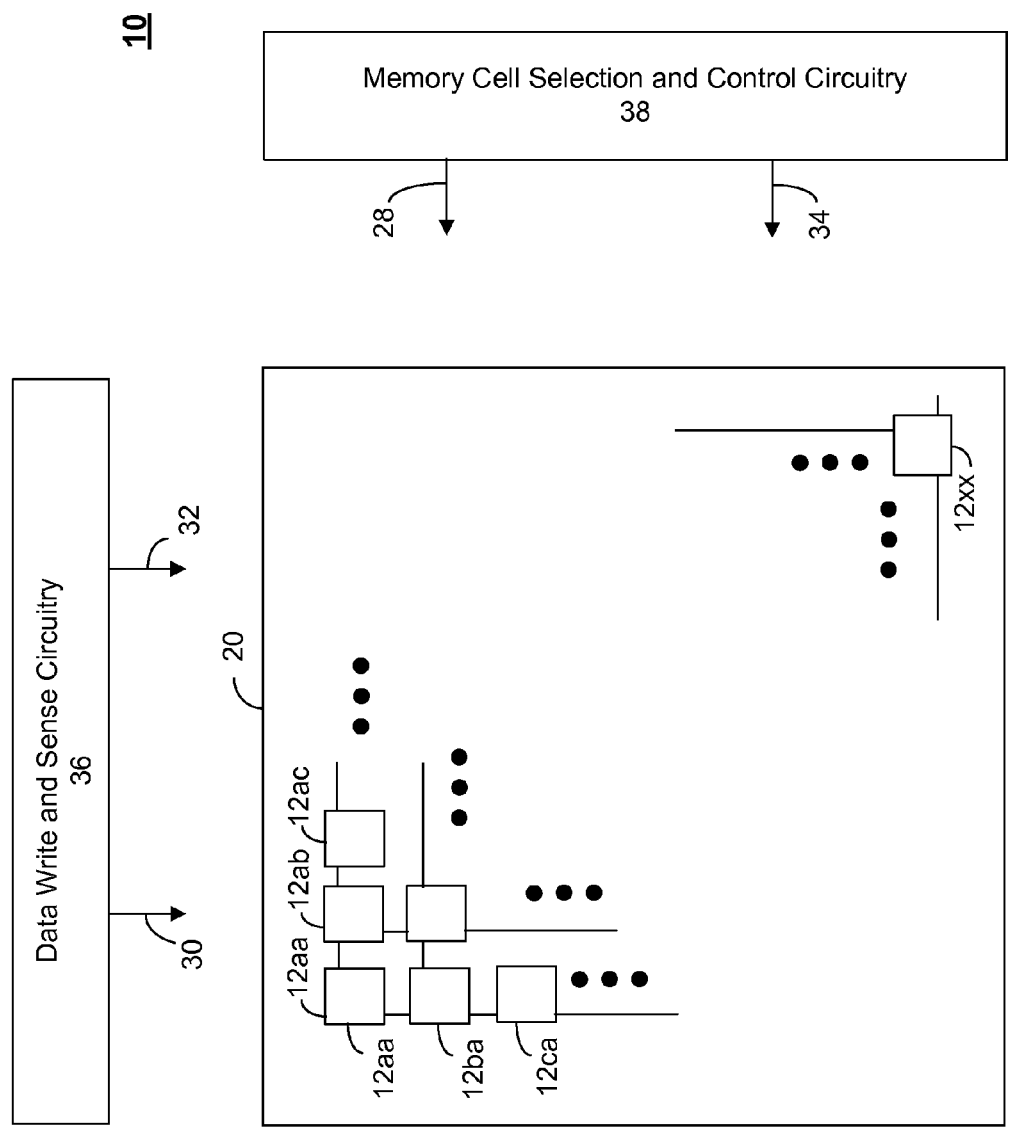
FIG. 1 shows a block diagram of a semiconductor memory device including a memory cell array, data write and sense circuitry, and memory cell selection and control circuitry in accordance with an embodiment of the present disclosure.

Referring to FIG. 1, there is shown a block is ram of a semiconductor memory device 10 comprising a memory cell array 20, data write and sense circuitry 36, and memory cell selection and control circuitry 38 in accordance with an embodiment of the present disclosure. The memory cell array 20 may comprise a plurality of memory cells 12 each coupled to the memory cell selection and control circuitry 38 via a word line (WL) 28 and a carrier injection line (EP) 34, and to the data write and sense circuitry 36 via a bit line (CN) 30 and a source line (EN) 32. It may be appreciated that the bit line (CN) 30 and the source line (EN) 32 are designations used to distinguish between two signal lines and they may be used interchangeably.

The data write and sense circuitry 36 may read data from and may write data to selected memory cells 12. In an exemplary embodiment, the data write and sense circuitry 36 may include a plurality of data sense amplifier circuits. Each data sense amplifier circuit may receive at least one bit line (CN) 30 and a current or voltage reference signal. For example, each data sense amplifier circuit may be a cross-coupled sense amplifier to sense a data state stored in a memory cell 12. The data write and sense circuitry 36 may include at least one multiplexer that may couple to a data sense amplifier circuit to at least one bit line (CN) 30. In an exemplary embodiment, the multiplexer may couple a plurality of bit lines (CN) 30 to a data sense amplifier circuit.

Each data sense amplifier circuit may employ voltage and/or current sensing circuitry and/or techniques, in an exemplary embodiment, each data sense amplifier circuit may employ current sensing circuitry and/or techniques. For example, a current sense amplifier may compare current from a selected memory cell 12 to a reference current (e.g., the current of one or more reference cells). From that comparison, it may be determined whether the selected memory cell 12 stores a logic high (e.g., binary "1" data state) or a logic low (e.g., binary "0" data state). It may be appreciated by one having ordinary skill in the art that various types or forms of the data write and sense circuitry 3 (including one or more sense amplifiers, using voltage or current sensing techniques, to sense a data state stored in a memory cell 12) may be employed to read data stored in the memory cells 12.

The memory cell selection and control circuitry 38 may select and/or enable one or more predetermined memory cells 12 to facilitate reading data therefrom by applying control signals on one or more word lines (WL) 28 and/or carrier injection lines (EP) 34. The memory cell selection and control circuitry 38 may generate such control signals from address signals, for example, row address signals. Moreover, the memory cell selection and control circuitry 38 may include a word line decoder and/or driver. For example, the memory cell selection and control circuitry 38 may include one or more different control/selection techniques (and circuitry thereof) to select and/or enable one or more predetermined memory cells 12. Notably, all such control/selection techniques, and circuitry thereof, whether now known or later developed, are intended to fall within the scope of the present disclosure.

In an exemplary embodiment, the semiconductor memory device 10 may implement a two step write operation whereby all the memory cells 12 in a row of memory cells 12 may be written to a predetermined data state by first executing "clear" or a logic low (e.g., binary "0" data state) write operation, whereby all of the memory cells 12 in the row of memory cells 12 are written to logic low (e.g., binary "0" data state). Thereafter, selected memory cells 12 in the row of memory cells 12 ma be selectively written to the predetermined data state (e.g., a logic high (binary "1" data state)). The semiconductor memory device 10 may also implement a one step write operation whereby selected memory of 12 in a row of memory cells 12 may be selectively written to either a logic high (e.g., binary "1" data state) or a logic low (e.g., binary "0" data state) without first implementing a "clear" operation. The semiconductor memory device 10 may employ any of the exemplary writing, preparation, holding, refresh, and/or reading techniques described herein.

The memory cells 12 may comprise N-type, P-type and/or both types of transistors. Circuitry that is peripheral to the memory cell array 20 (for example, sense amplifiers or comparators, row and column address decoders, as well as line drivers (not illustrated herein)) may also include P-type and/or N-type transistors. Regardless of whether P-type or N-type transistors are employed in memory cells 12 in the memory cell array 20, suitable voltage potentials (for example, positive or negative voltage potentials) for reading from the memory cells 12 will be described further herein.

Figure 2:
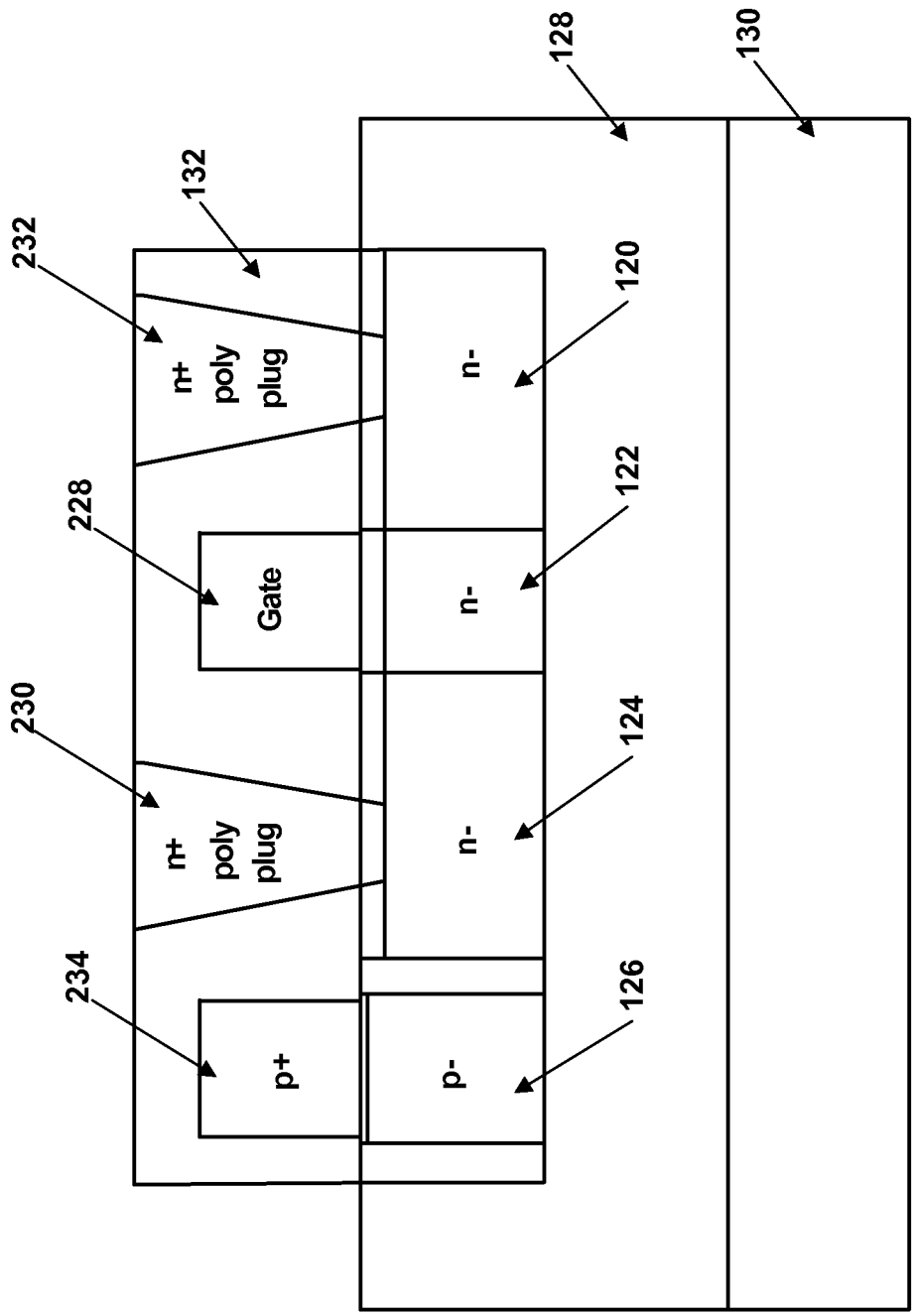
FIG. 2 shows a cross-sectional view of the memory cell shown in FIG. 1 in accordance with an embodiment of the present disclosure.

Referring to FIG. 2, there is shown a cross-sectional view of the memory cell 12 shown in FIG. 1 in accordance with an embodiment of the present disclosure. The memory cell 12 may comprise a first N− region 120, a second N− region 122, a third N− region 124, and/or a P− region 126. The first N− region 120, the second N− region 122, the third N− region 124, and/or the P− region 126 may be disposed in sequential contiguous relationship within a planar configuration that may extend horizontally or parallel to a plane defined by an oxide region 128 and/or a P− substrate 130. In an exemplary embodiment, the second N− region 122 may be an electrically floating body region of the memory cell 12 configured to accumulate/store charges that may be spaced apart from and capacitively coupled to the word line (WL) 28.

The first N− region 120 of the memory cell 12 may be coupled to the source line (EN) 32 via a first N+ poly plug 232. The first N+ poly plug 232 may be directly coupled to the first N− region 120 of the memory cell 12. The second N− region 122 of the memory cell 12 may be coupled to the word line (WL) 28 via a gate region 228. The gate region 228 may be capacitively coupled to the second N− region 122 of the memory cell 12. The third N− region 124 of the memory cell 12 may be coupled to a bit line (CN) 30 via a second N+ poly plug 230. The second N+ poly plug 230 may be directly coupled to the third N− region 124 of the memory cell 12. The P− region 126 of the memory cell 12 may be coupled to a carrier injection line (EP) 34 via a P+ region 234. The P+ region 234 may be directly coupled to the P− region 126 of the memory cell 12.

The first N− region 120, the second N− region 122, and the third N− region 124 may be formed of the same material or different materials. Also, the first N− region 120, the second N− region 122, and the third N− region 124 may be formed of the same material having various doping concentrations. In an exemplary embodiment, the first N− region 120, the second N− region 122, and the third N− region 124 may be formed of a semiconductor material (e.g., silicon) comprising donor impurities (e.g., nitrogen, arsenic, and/or phosphorus). In an exemplary embodiment, the first N− region 120, the second N− region 122, and/or the third N− region 124 may be formed of a silicon material with donor impurities having a concentration of $10^{15}$ atoms/cm$^3$ to $10^{18}$ atoms/cm$^3$.

The P− region 126 may be formed of a semiconductor material (e.g., intrinsic silicon) comprising acceptor impurities. For example, the P− region 126 may be formed of a silicon material doped with boron impurities. In an exemplary embodiment, the P− region 126 may be formed of a silicon material with acceptor impurities having a concentration of $10^{15}$ atoms/cm$^3$ to $10^{18}$ atoms/cm$^3$. In another exemplary embodiment, the P− region 126 may be formed of an undoped semiconductor material (e.g., intrinsic silicon).

The first N+ poly plug 232 and the second N+ poly plug 230 may be formed of the same material or different materials. The first N+ poly plug 232 and the second N+ poly plug 230 may be formed of a metal material, polysilicon material, silicon dioxide material, and/or a combination thereof. The first N+ poly plug 232 and the second N+ poly plug 230 may couple voltage potentials from the source line (EN) 32 and the bit line (CN) 30, respectively, to the first N− region 120 and the third N− region 124 of the memory cell 12. In another exemplary embodiment, the first N+ poly plug 232 and the second N+ poly plug 230 may be formed of tungsten, titanium, titanium nitride, polysilicon or a combination thereof. The first N+ poly plug 232 and the second N+ poly plug 230 may have a height extending from the first N– region 120 and the third N– region 124, respectively, to the source line (EN) 32 and the bit line (CN) 30.

The gate region 228 may be formed of a polycide material, a silicon material, a metal material, and/or a combination thereof. In another exemplary embodiment, the gate region 228 may be formed of a doped silicon layer. The gate region 228 may be formed of a semiconductor material (e.g., silicon) comprising acceptor impurities. For example, the gate region 228 may be formed of a silicon material doped with boron impurities.

The P+ region 234 may be formed of a semiconductor material (e.g., silicon) comprising acceptor impurities. For example, the P+ region 234 may be formed of a silicon material doped with boron impurities. In an exemplary embodiment, the P+ region 234 may be doped with acceptor impurities having a concentration of $10^{20}$ atom/cm$^3$ or higher.

The oxide layer 128 may be formed on the P– substrate 130. For example, the oxide layer 128 may be formed of an insulating material. The oxide layer 128 may include a continuous planar region configured above the P– substrate 130. In an exemplary embodiment, the oxide layer 128 may be formed of an insulating oxide material. The oxide layer 128 may form a trench region that may have a cross-sectional shape to accommodate one or more memory cells 12 therein. For example, the trench region may have a cross-sectional shape of a square, a rectangle, a cylinder, and/or other shapes that may accommodate one or more memory cells 12.

In an exemplary embodiment, the P– substrate 130 may be made of a semiconductor material (e.g., silicon) comprising acceptor impurities and may form a base of the memory cell array 20. In alternative exemplary embodiments, a plurality of P– substrates 130 may form the base of the memory cell array 20 or a single P– substrate 130 may form the base of the memory cell array 20. Also, the P– substrate 130 may be made in the form of a P-well substrate.

An insulating layer 132 may be formed on top of the oxide layer 128. For example, the insulating layer 132 may be formed of an insulating material, oxide material, and/or dielectric material. In an exemplary embodiment, the insulating layer 132 may be formed of a silicon nitride material. The insulating layer 132 may be formed above the oxide layer 128 to electrically insulating the first N+ poly plug 232, the gate region 228, the second N+ poly plug 230, and/or the P+ region 234.

Figure 3:
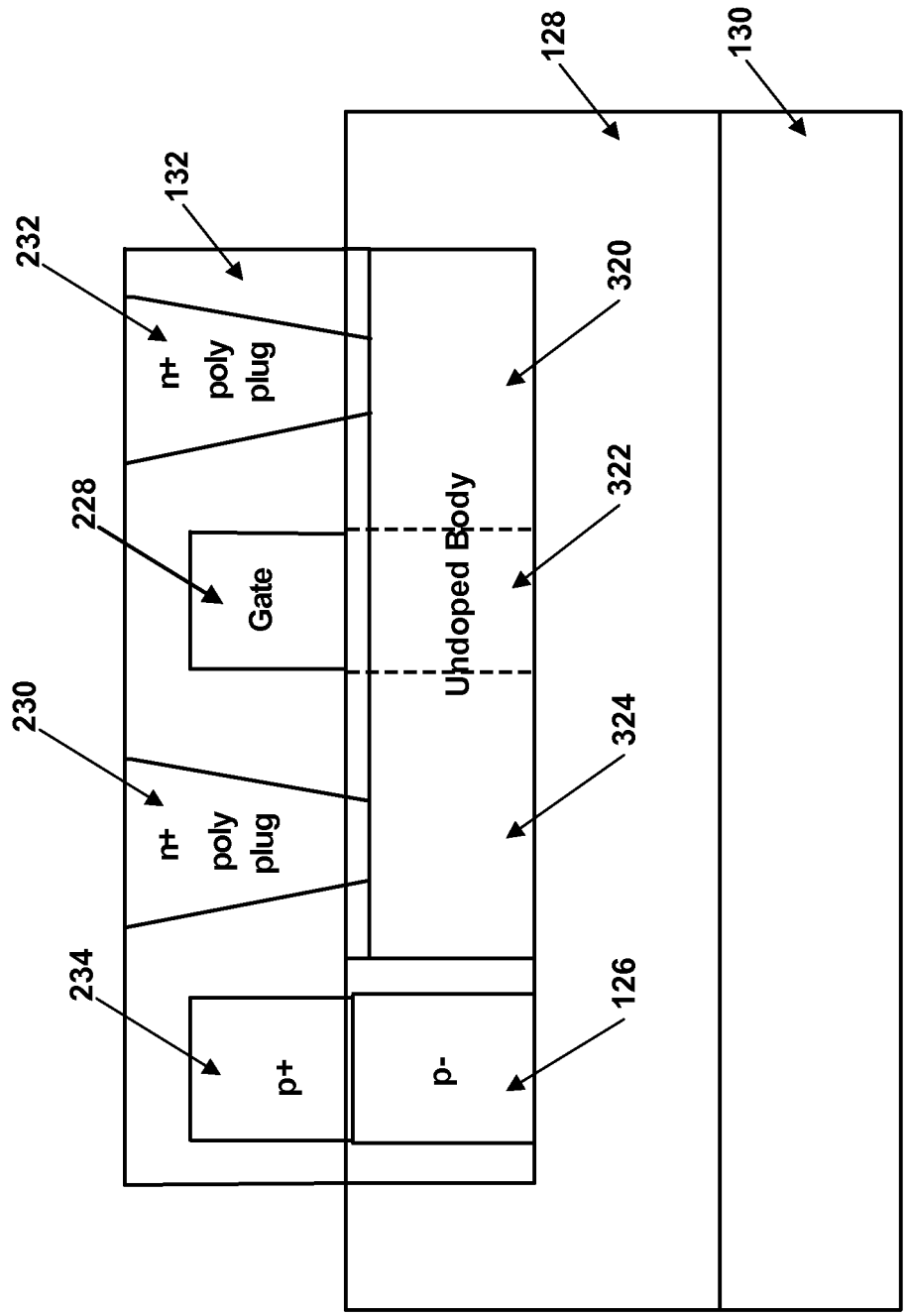
FIG. 3 shows a cross-sectional view of the memory cell shown in FIG. 1 in accordance with an alternate embodiment of the present disclosure.

Referring to FIG. 3, there is shown a cross-sectional view of the memory cell 12 shown in FIG. 1 in accordance with an alternate embodiment of the present disclosure. The memory cell 12 illustrated in FIG. 3 may be similar to the memory cell 12 illustrated in FIG. 2, except that the memory cell 12 may comprise a plurality of undoped regions. The plurality of undoped region may comprise a first undoped region 320 coupled a corresponding first N+ poly plug 232, a second undoped region 322 capacitively coupled to a corresponding gate region 228, and/or a third undoped region 324 coupled to a corresponding second N+ poly plug 230.

The plurality of undoped regions may be formed of the same material or different materials. For example, the plurality of undoped regions (e.g., the first undoped region 320, the second undoped region 322, and/or the third undoped region 324) may be formed of an undoped semiconductor material (e.g., intrinsic silicon).

Figure 4:
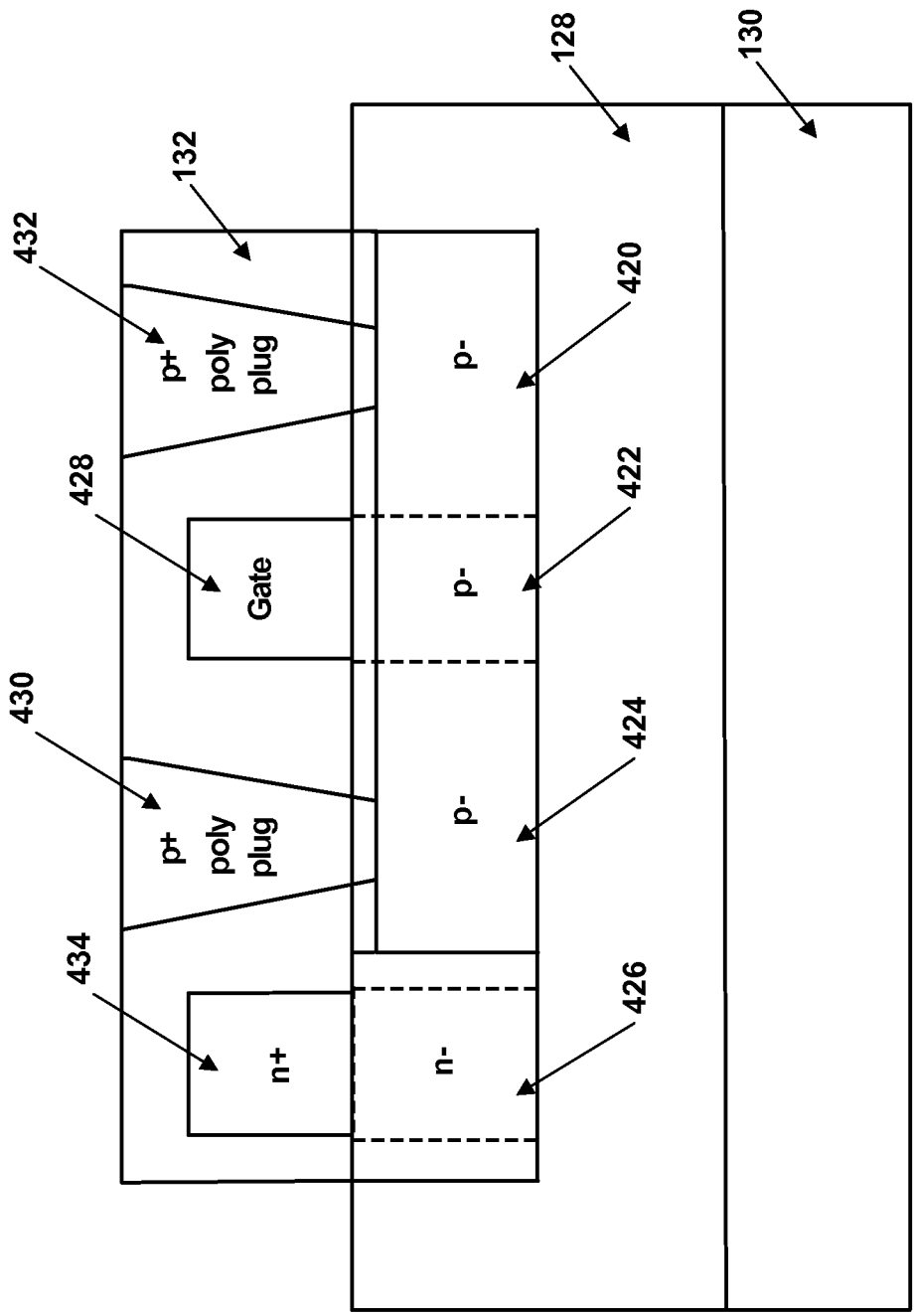
FIG. 4 shows a cross-sectional view of the memory cell shown in FIG. 1 in accordance with an embodiment of the present disclosure.

Referring to FIG. 4, there is shown a cross-sectional view of the memory cell 12 shown in FIG. 1 in accordance with an embodiment of the present disclosure. The memory cell 12 illustrated in FIG. 4 may be similar to the memory cell 12 illustrated in FIG. 2, except that the memory cell 12 may comprise a first P– region 420, a second P– region 422, a third P– region 424, and/or an N– region 426. The first P– region 420, the second P– region 422, the third P– region 424, and/or the N– region 426 may be disposed in sequential contiguous relationship within a planar configuration that may extend horizontally or parallel to a plane defined by an oxide region 128 and/or a P– substrate 130. In an exemplary embodiment, the second P– region 422 may be an electrically floating body region of the memory cell 12 configured to accumulate/store charges that may be spaced apart from and capacitively coupled to the word line (WL) 28.

The first P– region 420 of the memory cell 12 may be coupled to the source line (EN) 32 via a first P+ poly plug 432. The first P+ poly plug 432 may be directly coupled to the first P– region 420 of the memory cell 12. The second P– region 422 of the memory cell 12 may be coupled to the word line (WL) 28 via a gate region 428. The gate region 428 may be capacitively coupled to the second P– region 422 of the memory cell 12. The third P– region 424 of the memory cell 12 may be coupled to a bit line (CN) 30 via a second N+ poly plug 430. The second N+ poly plug 430 may be directly coupled to the third P– region 424 of the memory cell 12. The N– region 426 of the memory cell 12 may be coupled to a carrier injection line (EP) 34 via an N+ region 434. The N+ region 434 may be directly coupled to the N– region 426 of the memory cell 12.

The first P– region 420, the second P– region 422, and the third P– region 424 may be formed of the same material or different materials. Also, the first P– region 420, the second P– region 422, and the third P– region 424 may be formed of the same material having various doping concentrations. In an exemplary embodiment, the first P– region 420, the second P– region 422, and the third P– region 424 may be formed of a semiconductor material (e.g., silicon) comprising acceptor impurities. For example, the first P– region 420, the second P– region 422, and/or the third P– region 424 may be formed of a silicon material doped with boron impurities. In an exemplary embodiment, the first P– region 420, the second P– region 422, and/or the third P– region 424 may be formed of a silicon material with acceptor impurities having a concentration of $10^{15}$ atoms/cm$^3$ to $10^{18}$ atoms/cm$^3$.

The N– region 426 may be formed of a semiconductor material (e.g., intrinsic silicon) comprising donor impurities. For example, the N– region 426 may be formed of a silicon material doped with nitrogen, arsenic, and/or phosphorous impurities. In an exemplary embodiment, the N– region 426 may be formed of a silicon material with donor impurities having a concentration of $10^{15}$ atoms/cm$^3$ to $10^{18}$ atoms/cm$^3$. In another exemplary embodiment, the N– region 426 may be formed of an undoped semiconductor material (e.g., intrinsic silicon).

The first P+ poly plug 432 and/or the second P+ poly plug 430 may be formed of the same material or different materials. The first P+ poly plug 432 and the second P+ poly plug 430 may be formed of a metal material, polysilicon material, silicon dioxide material, and/or a combination thereof. The first P+ poly plug 432 and/or the second P+ poly plug 430 may couple voltage potentials from the source line (EN) 32 and the bit line (CN) 30, respectively, to the first P– region 420 and the third P– region 424 of the memory cell 12. In another exemplary embodiment, the first P+ poly plug 432 and/or the second P+ poly plug 430 may be formed of tungsten, titanium, titanium nitride, polysilicon or a combination thereof. The first P+ poly plug 432 and/or the second P+ poly plug 430 may have a height extending from the first P– region 420 and the third P– region 424, respectively, to the carrier injection line (EP) 34 and the bit line (CN) 30.

The gate region 428 may be formed of a polycide material, a silicon material, a metal material, and/or a combination thereof. In another exemplary embodiment, the gate region 428 may be formed of a doped silicon layer. The gate region 428 may be formed of a semiconductor material (e.g., silicon) comprising acceptor impurities. For example, the gate region 428 may be formed of a silicon material doped with boron impurities.

The N+ region 434 may be formed of a semiconductor material (e.g., silicon) comprising donor impurities. For example, the N+ region 434 may be formed of a silicon material doped with nitrogen, arsenic, and/or phosphorous impurities. In an exemplary embodiment, the N+ region 434 may be formed of a silicon material with donor impurities having a concentration of $10^{20}$ atom/cm$^3$ or higher.

Figure 5:
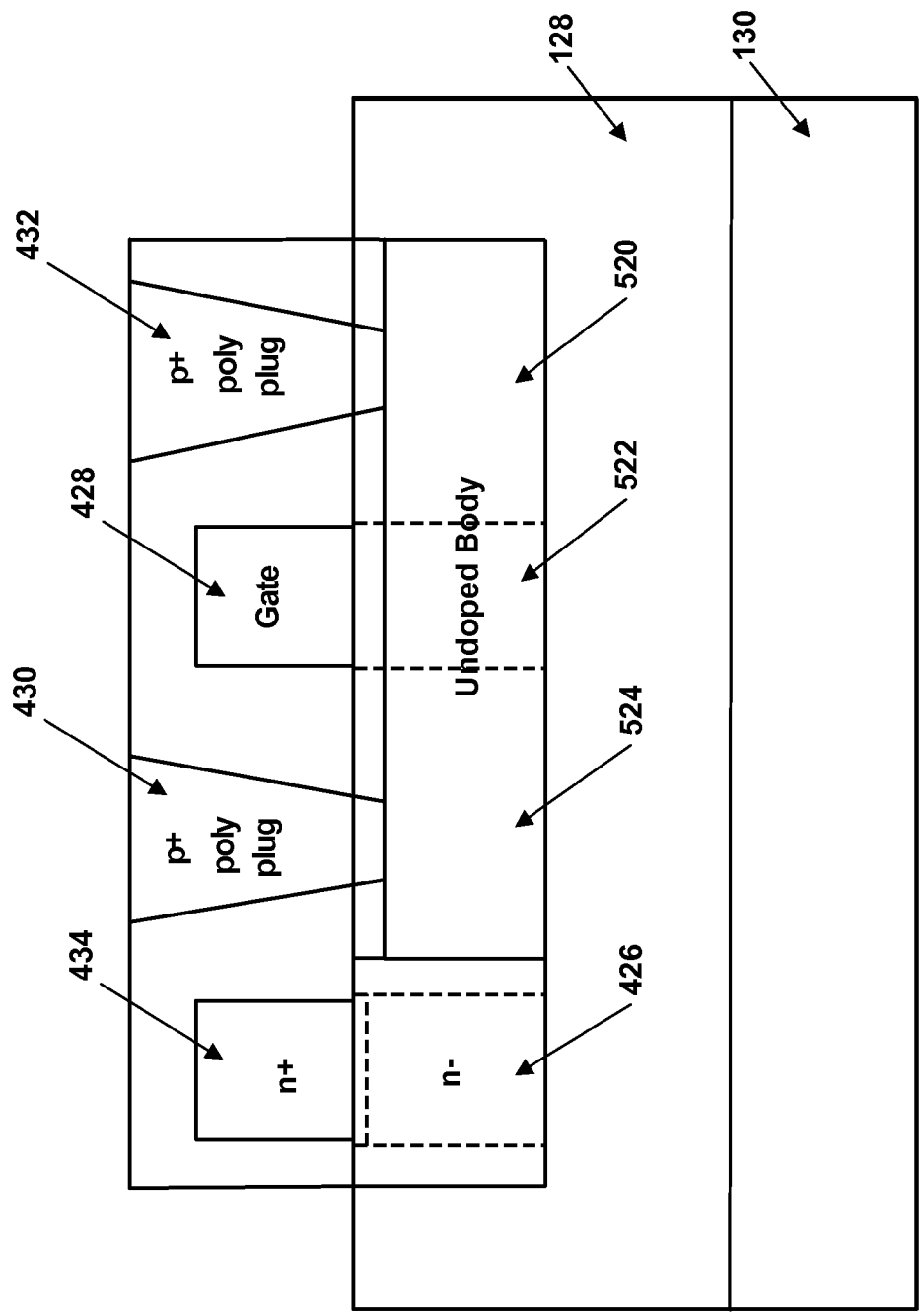
FIG. 5 shows a cross-sectional view of the memory cell shown in FIG. 1 in accordance with an alternate embodiment of the present disclosure.

Referring to FIG. 5, there is shown a cross-sectional view of the memory cell 12 shown in FIG. 1 in accordance with an alternate embodiment of the present disclosure. The memory cell 12 illustrated in FIG. 5 may be similar to the memory cell 12 illustrated in FIG. 4, except that the memory cell 12 may comprise a plurality of undoped regions. The plurality of undoped region may comprise a first undoped region 520 coupled a corresponding first P+ poly plug 432, a second undoped region 522 capacitively coupled to a corresponding gate region 428, and/or a third undoped region 524 coupled to a corresponding second N+ poly plug 430.

The plurality of undoped regions may be formed of the same material or different materials. For example, the plurality of undoped regions (e.g., the first undoped region 420, the second undoped region 422, and/or the third undoped region 424) may be formed of an undoped semiconductor material (e.g., intrinsic silicon).

Figure 6:
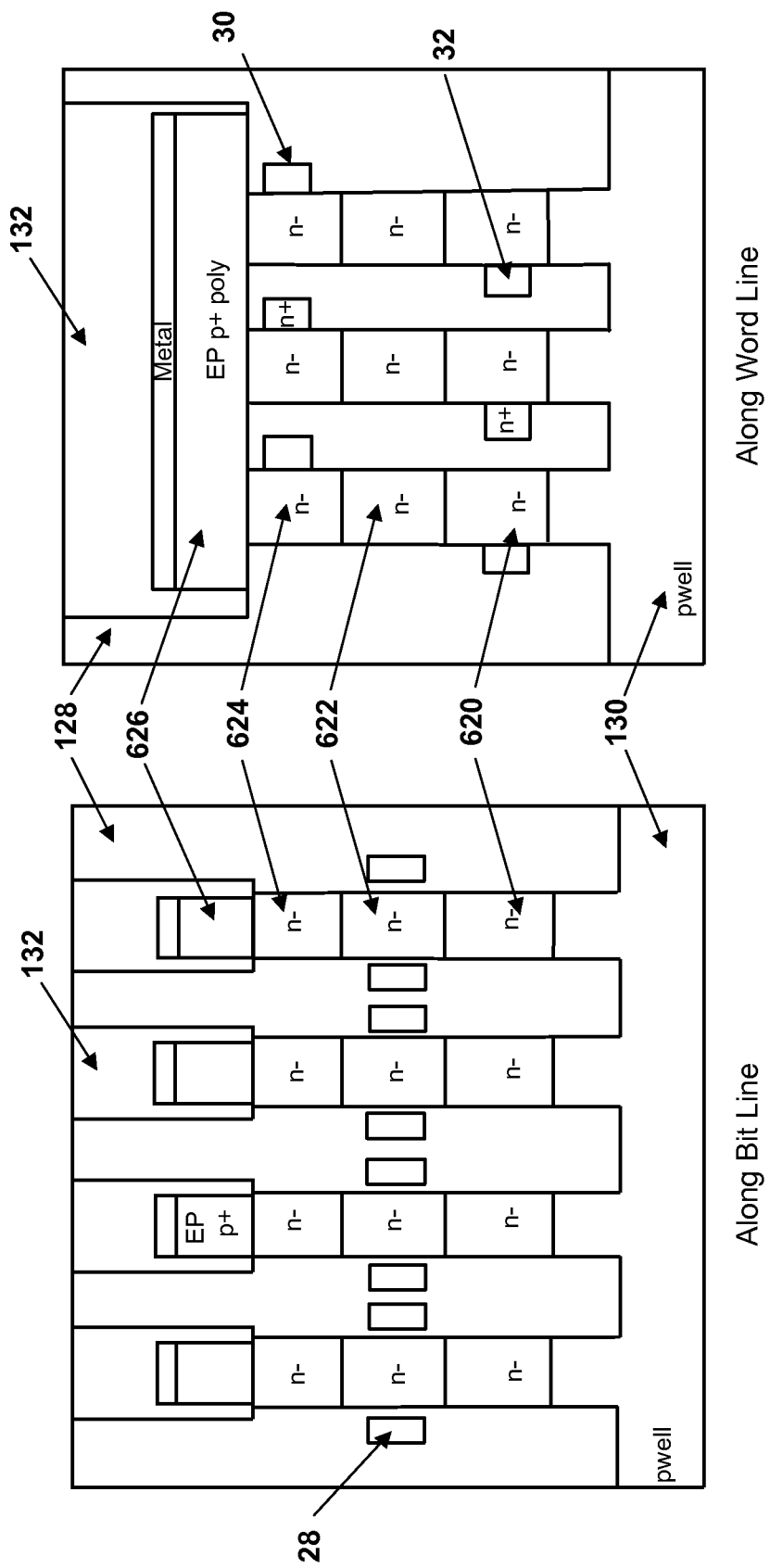
FIG. 6 shows cross-sectional views of at least a portion of the memory cell array shown in FIG. 1 in accordance with an embodiment of the present disclosure.

Referring to FIG. 6, there is shown cross-sectional views of at least a portion of the memory cell array 20 shown in FIG. 1 in accordance with an embodiment of the present disclosure. FIG. 6 illustrates a cross-sectional view of at least a portion of the memory cell array 20 along the bit line (CN) 30 and a cross-sectional view of at least a portion of the memory cell array 20 along the word line (WL) 28. The memory cells 12 of the memory cell array 20 may be implemented in a vertical configuration having various regions. For example, the memory cell 12 may comprise a first N− region 620, a second N− region 622, a third N− region 624, and/or a P+ region 626. The first N− region 620, the second N− region 622, the third N− region 624, and/or the P+ region 626 may be disposed in a sequential contiguous relationship, and may extend vertically from a plane defined by a P− substrate 130. In an exemplary embodiment, the second N− region 622 may be an electrically floating body region of the memory cell 12 configured to accumulate/store charges, and may be spaced apart from and capacitively coupled to the plurality of word lines (WL) 28.

The first N− region 620 of the memory cell 12 may be coupled to the source line (EN) 32. The second N− region 622 of the memory cell 12 may be capacitively coupled to the word line (WL) 28. The third N− region 624 of the memory cell 12 may be coupled to a bit line (CN) 30. The P+ region 626 of the memory cell 12 may be coupled to a carrier injection line (EP) 34.

The first N− region 620, the second N− region 622, and the third N− region 624 may be formed of the same material or different materials. Also, the first N− region 620, the second N− region 622, and the third N− region 624 may be formed of the same material having various doping concentrations. In an exemplary embodiment, the first N− region 620, the second N− region 622, and the third N− region 624 may be formed of a semiconductor material (e.g., silicon) comprising donor impurities (e.g., nitrogen, arsenic, and/or phosphorus). In an exemplary embodiment, the first N− region 620, the second N− region 622, and/or the third N− region 624 may be formed of a silicon material with donor impurities having a concentration of $10^{15}$ atoms/cm$^3$ to $10^{18}$ atoms/cm$^3$.

The P+ region 626 may be formed of at least one layer. In an exemplary embodiment, the P+ region 626 may comprise a plurality of layers. For example, the first layer of the P+ region 626 may be formed of a polysilicon material or silicon dioxide material, and/or a combination thereof. In another exemplary embodiment, the first layer of the P+ region 626 may be formed of a semiconductor material (e.g., intrinsic silicon) comprising acceptor impurities. For example, the first layer of the P+ region 626 may be formed of a silicon material doped with boron impurities. In an exemplary embodiment, the first layer of the P+ region 626 may be formed of a silicon material with acceptor impurities having a concentration of $10^{18}$ atoms/cm$^3$ or above. The second layer of the P+ region 626 may be formed of a metal material, polysilicon material, silicon dioxide material, and/or a combination thereof. In an exemplary embodiment, the second layer of the P+ region 626 may be formed of tungsten, titanium, titanium nitride, polysilicon or a combination thereof.

The source line (EN) 32 may be formed of a metal material. In another exemplary embodiment, the source line (EN) 32 may be formed of a polycide material (e.g., a combination of a metal material and a silicon material). In other exemplary embodiments, the source line (EN) 32 may be formed of an N+ doped silicon layer. The source line (EN) 32 may provide voltage potentials to the first N− region 620 of the memory cells 12. For example, the source line (EN) 32 may be coupled to a plurality of memory cells 12 (e.g., a column or a row of memory cells 12 of the memory cell array 20). The source line (EN) 32 may be configured on a side portion of the first N− region 620.

The word lines (WL) 28 may be capacitively coupled to the second N− region 622. The word lines (WL) 28 may be oriented in a row direction of the memory cell array 20 and coupled to a plurality of memory cells 12. The word lines (WL) 28 may be arranged on side portions of the memory cells 12 (e.g., memory cells 12 located on a row direction of the memory cell array 20). For example, the word lines (WL) 28 may be arranged at two side portions of the second N− region 622 of the memory cells 12.

For example, the word lines (WL) 28 may be formed of a polycide material (e.g., a combination of a metal material and a silicon material), a metal material, and/or a combination of a polycide material and a metal material. In another exemplary embodiment, the word lines (WL) 28 may be formed of an N+ doped silicon material. In an exemplary embodiment, the word lines (WL) 28 may capacitively couple a voltage/current source of the memory cell selection and control circuitry 38 to the second N− region 622 of the memory cell 12. In an exemplary embodiment, the first word line (WL) 28 may implement a write logic low (e.g., binary "0" data state) operation on the memory cell 12, while the second word line (WL) 28 may implement a write logic high (e.g., binary "1" data state) operation.

The bit line (CN) 30 may be coupled to the third N− region 624 of the memory cell 12. The bit line (CN) 30 may be formed of a metal material. In another exemplary embodiment, the bit line (CN) 30 may be formed of a polycide material (e.g., a combination of a metal material and a silicon material). In other exemplary embodiments, the bit line (CN) 30 may be formed of an N+ doped silicon layer. For example, the bit line (CN 30 may be coupled to a plurality of memory cells 12. The bit line (CN) 30 may be configured on a side portion of the third N− region 624. In an exemplary embodiment, the bit line (CN) 30 may be configured on an opposite side portion as the source line (EN) 30.

An oxide layer 128 may be formed on the P− substrate 130. For example, the oxide layer 128 may be formed of an insulating material. In an exemplary embodiment, the oxide layer 128 may be formed of an insulating oxide material. The oxide layer 128 may include a plurality of barrier walls formed of an insulating oxide material. The plurality of barrier walls may be oriented in a column direction and a row direction of the memory cell array 20. For example, a first barrier wall of the plurality of barrier walls may be oriented in a column direction. A second barrier wall of the plurality of barrier walls may be oriented in a row direction. In an exemplary embodiment, the first barrier wall oriented in the column direction and the second barrier wall oriented in the row direction may intersect to form a trench region. The oxide layer 128 may form a trench region that may have a cross-sectional shape to accommodate one or more memory cells 12 therein. For example, the trench region may have a cross-sectional shape of a square, a rectangle, a cylinder, and/or other shapes that may accommodate one or more memory cells 12.

In an exemplary embodiment, the P− substrate 130 may be made in the form of a P-well substrate. In another exemplary embodiment, the P− substrate 130 may be made of a semiconductor material (e.g., silicon) comprising acceptor impurities and may form a base of the memory cell array 20. In alternative exemplary embodiments, a plurality of P− substrates 130 may form the base of the memory cell array 20 or a single P− substrate 130 may form the base of the memory cell array 20.

An insulating layer 132 may be formed on top of the P+ region 626. For example, the insulating layer 132 may be formed of an insulating material, oxide material, and/or dielectric material. In an exemplary embodiment, the insulating layer 132 may be formed of a silicon nitride material. The insulating layer 132 may be formed above the P+ region 626 to electrically insulating the P+ region 626.

Figure 7:
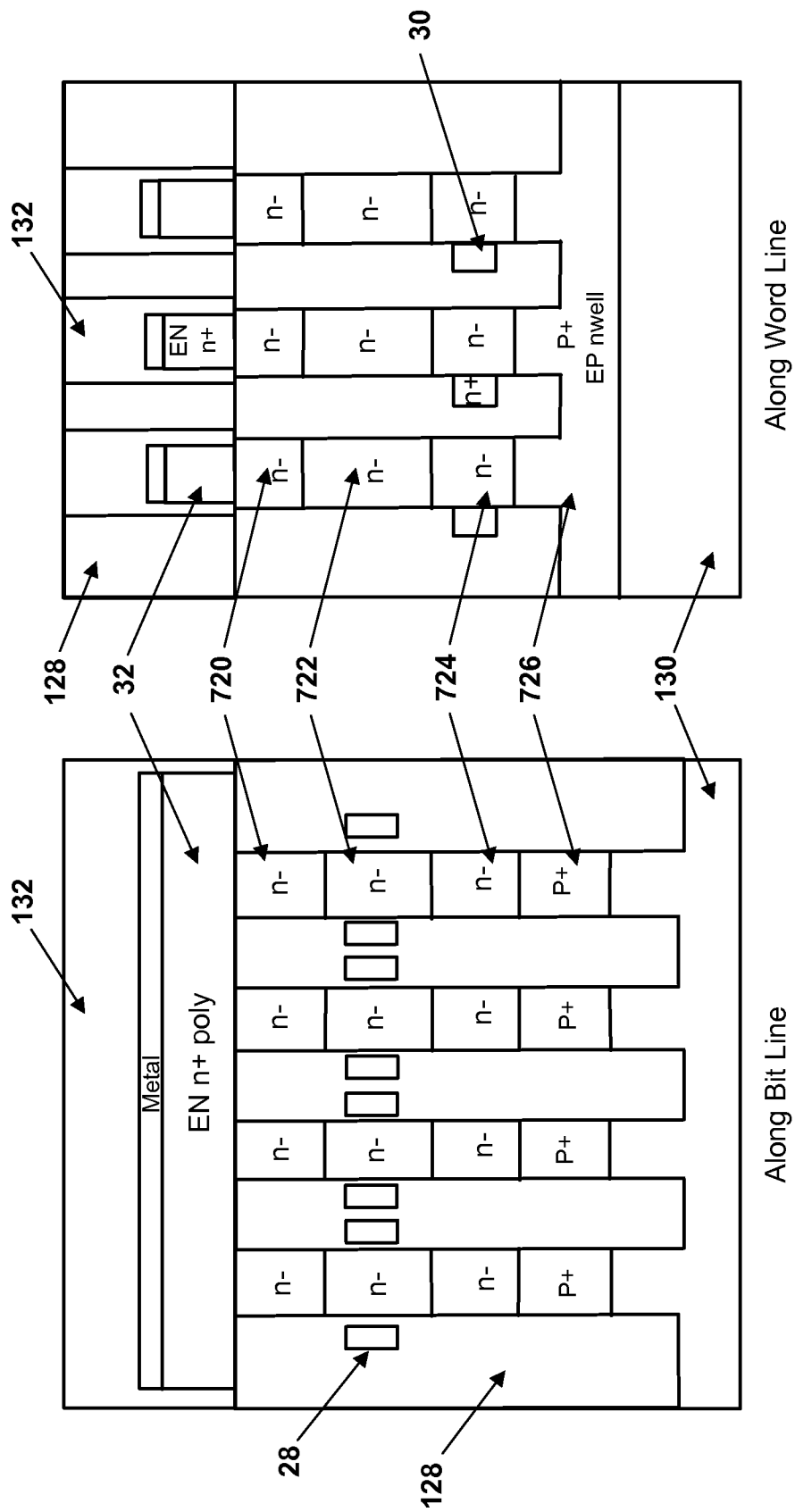
FIG. 7 shows cross-sectional views of at least a portion of the memory cell array shown in FIG. 1 in accordance with an alternate embodiment of the present disclosure.

Referring to FIG. 7, there is shown cross-sectional views of at least a portion of the memory cell array 20 shown in FIG. 1 in accordance with an alternate embodiment of the present disclosure. FIG. 7 illustrates a cross-sectional view of at least a portion of the memory cell array 20 along the bit line (CN) 30 and a cross-sectional view of at least a portion of the memory cell array 20 along the word line (WL) 28. The memory cells 12 of the memory cell array 20 may be implemented in a vertical configuration having various regions. For example, the memory cell 12 may comprise a first N− region 720, a second N− region 722, a third N− region 724, and/or a P+ region 726. The first N− region 720, the second N− region 722, the third N− region 724, and/or the P+ region 726 may be disposed in a sequential contiguous relationship, and may extend vertically from a plane defined by an N+ substrate 130. In an exemplary embodiment, the second N− region 722 may be an electrically floating body region of the memory cell 12 configured to accumulate/store charges, and may be spaced apart from and capacitively coupled to the plurality of word lines (WL) 28.

The first N− region 720 of the memory cell 12 may be coupled to the source line (EN) 32. The second N− region 722 of the memory cell 12 may be capacitively coupled to the word line (WL) 28. The third N− region 724 of the memory cell 12 may be coupled to a bit line (CN) 30. The P+ region 726 of the memory cell 12 may be coupled to a carrier injection line (EP) 34.

The first N− region 720, the second N− region 722, and the third N− region 724 may be formed of the same material or different materials. Also, the first N− region 720, the second N− region 722, and the third N− region 724 may be formed of the same material having various doping concentrations. In an exemplary embodiment, the first N− region 720, the second N− region 722, and the third N− region 724 may be formed of a semiconductor material (e.g., silicon) comprising donor impurities (e.g., nitrogen, arsenic, and/or phosphorus). In an exemplary embodiment, the first N− region 720, the second N− region 722, and/or the third N− region 724 may be formed of a silicon material with donor impurities having a concentration of $10^{15}$ atoms/cm$^3$ to $10^{18}$ atoms/cm$^3$.

The P+ region 726 may be made in the form of a P-well region. In another exemplary embodiment, the P+ region 726 may be made of a semiconductor material (e.g., silicon) comprising acceptor impurities and may form a base of the one or more memory cells 12. For example, the P+ region 726 may form the base of a row or a column of memory cells 12 of the memory cell array 20. The P+ region 726 may comprise a continuous planar region configured above the N+ substrate 130. The P+ region 726 may also comprise a plurality of barrier walls formed on the continuous planar region. The plurality of barrier walls of the P+ region 726 may be oriented in a column direction and/or a row direction of the memory cell array 20.

The source line (EN) 32 may be formed of at least one layer. In an exemplary embodiment, the source line (EN) 32 may comprise a plurality of layers. For example, the first layer of the source line (EN) 32 may be formed of a polysilicon material or silicon dioxide material, and/or a combination thereof. In another exemplary embodiment, the first layer of the source line (EN) 32 may be formed of a semiconductor material (e.g., intrinsic silicon) comprising donor impurities. For example, the first layer of the source line (EN) 32 may be formed of a silicon material doped with nitrogen, arsenic, and/or phosphorus impurities. In an exemplary embodiment, the first layer of the source line (EN) 32 may be formed of a silicon material with acceptor impurities having a concentration of $10^{18}$ atoms/cm$^3$ or above. The second layer of the source line (EN) 32 may be formed of a metal material, polysilicon material, silicon dioxide material, and/or a combination thereof. In an exemplary embodiment, the second layer of the source line (EN) 32 may be formed of tungsten, titanium, titanium nitride, polysilicon or a combination thereof. For example, the source line (EN) 32 may be coupled to a plurality of memory cells 12 (e.g., a column or a row of memory cells 12 of the memory cell array 20). The source line (EN) 32 may be configured above the first N− region 720.

The word lines (WL) 28 may be capacitively coupled to the second N− region 722. The word lines (WL) 28 may be oriented in a row direction of the memory cell array 20 and coupled to a plurality of memory cells 12. The word lines (WL) 28 may be arranged on side portions of the memory cells 12 (e.g., memory cells 12 located on a row direction of the memory cell array 20). For example, the word lines (WL) 28 may be arranged at two side portions of the second N− region 722 of the memory cells 12.

For example, the word lines (WL) 28 may be formed of a polycide material (e.g., a combination of a metal material and a silicon material), a metal material, and/or a combination of a polycide material and a metal material. In another exemplary embodiment, the word lines (WL) 28 may be formed of an N+ doped silicon material. In an exemplary embodiment, the word lines (WL) 28 may capacitively couple a voltage potential/current source of the memory cell selection and control circuitry 38 to the second N− region 722 of the memory cell 12. In an exemplary embodiment, the first word line (WL) 28 may implement a write logic low (e.g., binary "0" data state) operation on the memory cell 12, while the second word line (WL) 28 may implement a write logic high (e.g., binary "1" data state) operation.

The bit line (CN) 30 may be coupled to the third N− region 724 of the memory cell 12. The bit line (CN) 30 may be formed of a metal material. In another exemplary embodiment, the bit line (CN) 30 may be formed of a polycide material (e.g., a combination of a metal material and a silicon material). In other exemplary embodiments, the bit line (CN) 30 may be formed of an N+ doped silicon layer. For example, the bit line (CN) 30 may be coupled to a plurality of memory cells 12. The bit line (CN) 30 may be configured on a side portion of the third N− region 724.

An oxide layer 128 may be formed on the P+ region 726 and/or the N+ substrate 130. For example, the oxide layer 128 may be formed of an insulating material. In an exemplary embodiment, the oxide layer 128 may be formed of an insulating oxide material. The oxide layer 128 may include a plurality of barrier walls formed of an insulating oxide material. The plurality of barrier walls may be oriented in a column direction and a row direction of the memory cell array 20. For example, a first barrier wall of the plurality of barrier walls may be oriented in a column direction. A second barrier wall of the plurality of barrier walls may be oriented in a row direction. The first barrier wall oriented in a column direction may have a different height from the second barrier wall oriented in a row direction. In an exemplary embodiment, the first barrier wall oriented in the column direction and the second barrier wall oriented in the row direction may intersect to form a trench region. The oxide layer 128 may form a trench region that may have a cross-sectional shape to accommodate one or more memory cells 12 therein. For example, the trench region may have a cross-sectional shape of a square, a rectangle, a cylinder, and/or other shapes that may accommodate one or more memory cells 12.

In an exemplary embodiment, the N+ substrate 130 may be made in the form of an N-well substrate. In another exemplary embodiment, the N+ substrate 130 may be made of a semiconductor material (e.g., silicon) comprising donor impurities and may form a base of the memory cell array 20. In alternative exemplary embodiments, a plurality of N+ substrates 130 may form the base of the memory cell array 20 or a single N+ substrate 130 may form the base of the memory cell array 20.

An insulating layer 132 may be formed on top of the first N− region 720. For example, the insulating layer 132 may be formed of an insulating material, oxide material, and/or dielectric material. In an exemplary embodiment, the insulating layer 132 may be formed of a silicon nitride material. The insulating layer 132 may be formed above the first N− region 720 to electrically insulating the source line (EN) 32.

Figure 8:
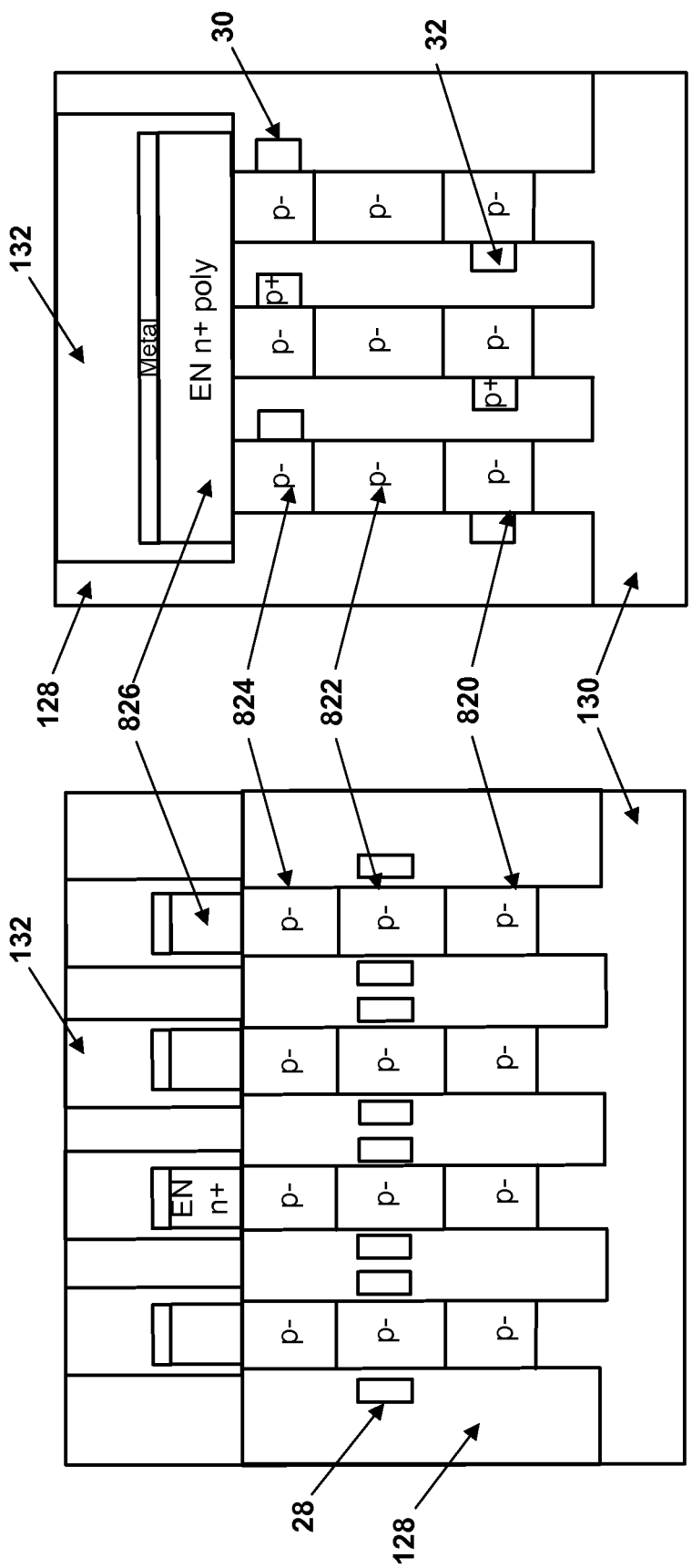
FIG. 8 shows cross-sectional views of at least a portion of the memory cell array shown in FIG. 1 in accordance with an alternate embodiment of the present disclosure.

Referring to FIG. 8, there is shown cross-sectional views of at least a portion of the memory cell array 20 shown in FIG. 1 in accordance with an embodiment of the present disclosure. FIG. 8 illustrates a cross-sectional view of at least a portion of the memory cell array 20 along the bit line (CN) 30 and a cross-sectional view of at least a portion of the memory cell array 20 along the word line (WL) 28. The memory cells 12 of the memory cell array 20 may be implemented in a vertical configuration having various regions. For example, the memory cell 12 may comprise a first P− region 820, a second P− region 822, a third P− region 824, and/or an N+ region 826. The first P− region 820, the second P− region 822, the third P− region 824, and/or the N+ region 826 may be disposed in a sequential contiguous relationship, and may extend vertically from a plane defined by an N+ substrate 130. In an exemplary embodiment, the second P− region 822 may be an electrically floating body region of the memory cell 12 configured to accumulate/store charges, and may be spaced apart from and capacitively coupled to the plurality of word lines (WL) 28.

The first P− region 820 of the memory cell 12 may be coupled to the source line (EN) 32. The second P− region 822 of the memory cell 12 may be capacitively coupled to the word line (WL) 28. The third P− region 824 of the memory cell 12 may be coupled to a bit line (CN) 30. The N+ region 826 of the memory cell 12 may be coupled to a carrier injection line (EP) 34.

The first P− region 820, the second P− region 822, and the third P− region 824 may be formed of the same material or different materials. Also, the first P− region 820, the second P− region 822, and the third P− region 824 may be formed of the same material having various doping concentrations. In an exemplary embodiment, the first P− region 820, the second P− region 822, and the third P− region 824 may be formed of a semiconductor material (e.g., silicon) comprising acceptor impurities. The first P− region 820, the second P− region 822, and/or the third P− region 824 may be formed of a silicon material doped with boron impurities. In an exemplary embodiment, the first P− region 820, the second P− region 822, and/or the third P− region 824 may be formed of a silicon material with acceptor impurities having a concentration of $10^{15}$ atoms/cm$^3$ to $10^{18}$ atoms/cm$^3$.

The N+ region 826 may be formed of at least one layer. In an exemplary embodiment, the N+ region 826 may comprise a plurality of layers. For example, the first layer of the N+ region 826 may be formed of a polysilicon material or silicon dioxide material, and/or a combination thereof. In another exemplary embodiment, the first layer of the N+ region 826 may be formed of a semiconductor material (e.g., intrinsic silicon) comprising donor impurities. For example, the first layer of the N+ region 826 may be formed of a silicon material doped with boron impurities. In an exemplary embodiment, the first layer of the N+ region 826 may be formed of a silicon material with donor impurities having a concentration of $10^{18}$ atoms/cm$^3$ or above. The second layer of the N+ region 826 may be formed of a metal material, polysilicon material, silicon dioxide material, and/or a combination thereof. In an exemplary embodiment, the second layer of the N+ region 826 may be formed of tungsten, titanium, titanium nitride, polysilicon or a combination thereof.

The source line (EN) 32 may be formed of a metal material. In another exemplary embodiment, the source line (EN) 32 may be formed of a polycide material (e.g., a combination of a metal material and a silicon material). In other exemplary embodiments, the source line (EN) 32 may be formed of a P+ doped silicon layer. The source line (EN) 32 may provide voltage potentials to the first P− region 820 of the memory cells 12. For example, the source line (EN) 32 may be coupled to a plurality of memory cells 12 (e.g., a column or a row of memory cells 12 of the memory cell array 20). The source line (EN) 32 may be configured on a side portion of the first P− region 820.

The word lines (WL) 28 may be capacitively coupled to the second P− region 822. The word lines (WL) 28 may be oriented in a row direction of the memory cell array 20 and coupled to a plurality of memory cells 12. The word lines (WL) 28 may be arranged on side portions of the memory cells 12 (e.g., memory cells 12 located on a row direction of the memory cell array 20). For example, the word lines (WL) 28 may be arranged at two side portions of the second P− region 822 of the memory cells 12.

For example, the word lines (WL) 28 may be formed of a polycide material (e.g., a combination of a metal material and a silicon material), a metal material, and/or a combination of a polycide material and a metal material. In another exemplary embodiment, the word lines (WL) 28 may be formed of a P+ doped silicon material. In an exemplary embodiment, the word lines (WL) 28 may capacitively couple a voltage/current source of the memory cell selection and control circuitry 38 to the second P− region 822 of the memory cell 12. In an exemplary embodiment, the first word line (WL) 28 arranged on a side portion of the second P− region 822 may implement a write logic low (e.g., binary "0" data state) operation on the memory cell 12, while the second word line (WL) 28 arranged on an opposite side portion of the second P− region 822 may implement a write logic high (e.g., binary "1" data state) operation.

The bit line (CN) 30 may be coupled to the third P− region 824 of the memory cell 12. The bit line (CN) 30 may be formed of a metal material. In another exemplary embodiment, the bit line (CN) 30 may be formed of a polycide material (e.g., a combination of a metal material and a silicon material). In other exemplary embodiments, the bit line (CN) 30 may be formed of a P+ doped silicon layer. For example, the bit line (CN) 30 may be coupled to a plurality of memory cells 12. The bit line (CN) 30 may be configured on a side portion of the third P− region 824. In an exemplary embodiment, the bit line (CN) 30 may be configured on an opposite side portion as the source line (EN) 30.

An oxide layer 128 may be formed on the N+ substrate 130. For example, the oxide layer 128 may be formed of an insulating material. In an exemplary embodiment, the oxide layer 128 may be formed of an insulating oxide material. The oxide layer 128 may include a plurality of barrier walls formed of an insulating oxide material. The plurality of barrier walls may be oriented in a column direction and a row direction of the memory cell array 20. For example, a first barrier wall of the plurality of barrier walls may be oriented in a column direction. A second barrier wall of the plurality of barrier walls may be oriented in a row direction. In an exemplary embodiment, the first barrier wall oriented in the column direction and the second barrier wall oriented in the row direction may intersect to form a trench region. The oxide layer 128 may form a trench region that may have a cross-sectional shape to accommodate one or more memory cells 12 therein. For example, the trench region may have a cross-sectional shape of a square, a rectangle, a cylinder, and/or other shapes that may accommodate one or more memory cells 12.

In an exemplary embodiment, the N+ substrate 130 may be made in the form of an N-well substrate. In another exemplary embodiment, the N+ substrate 130 may be made of a semiconductor material (e.g., silicon) comprising donor impurities and may form a base of the memory cell array 20. In alternative exemplary embodiments, a plurality of N+ substrates 130 may form the base of the memory cell array 20 or a single N+ substrate 130 may form the base of the memory cell array 20.

An insulating layer 132 may be formed on top of the N+ region 826. For example, the insulating layer 132 may be formed of an insulating material, oxide material, and/or dielectric material. In an exemplary embodiment, the insulating layer 132 may be formed of a silicon nitride material. The insulating layer 132 may be formed above the N+ region 826 to electrically insulating the N+ region 826.

Figure 9:
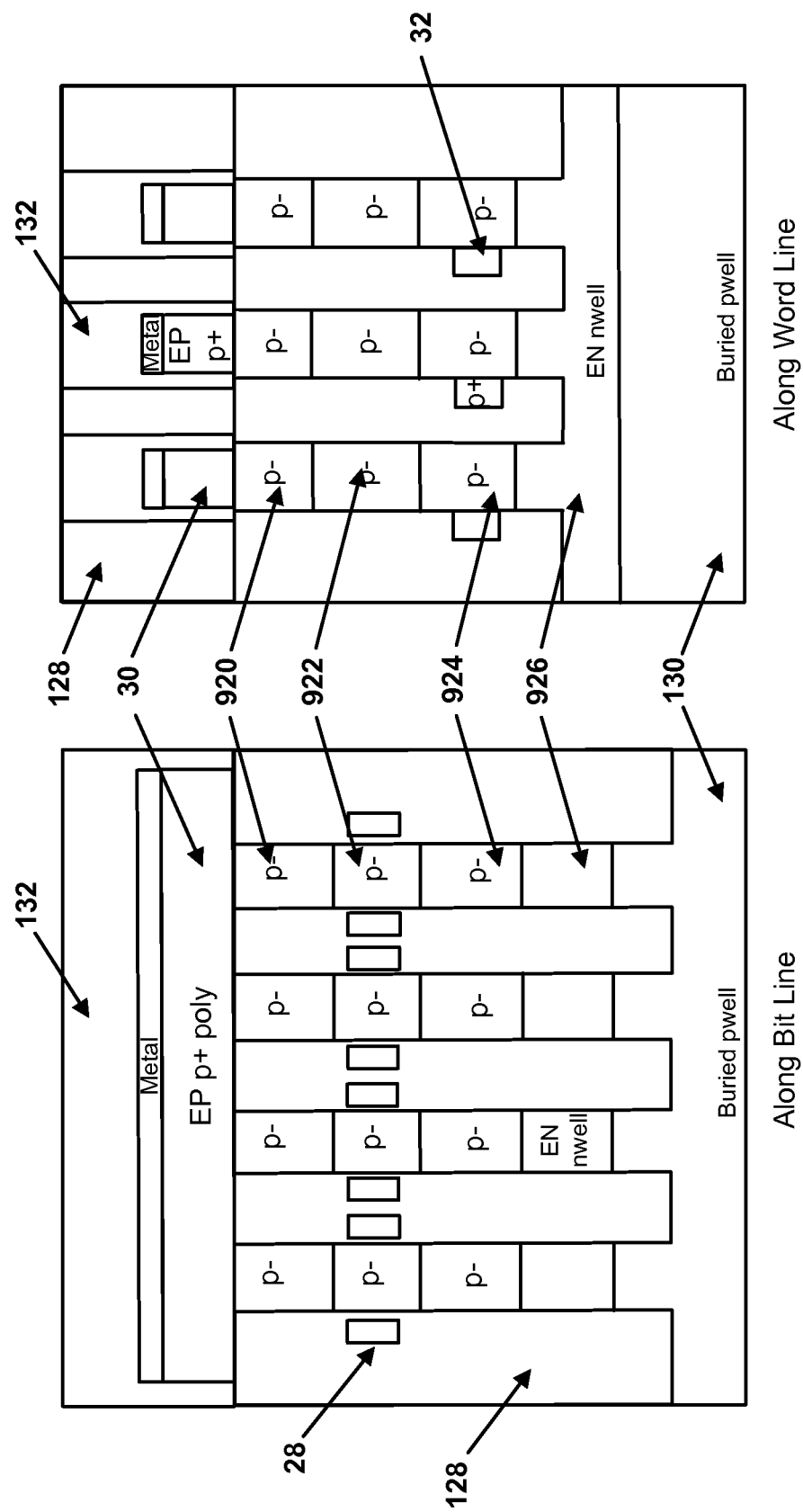
FIG. 9 shows cross-sectional views of at least a portion of the memory cell array shown in FIG. 1 in accordance with an alternate embodiment of the present disclosure.

Referring to FIG. 9, there is shown cross-sectional views of at least a portion of the memory cell array 20 shown in FIG. 1 in accordance with an alternate embodiment of the present disclosure. FIG. 9 illustrates a cross-sectional view of at least a portion of the memory cell array 20 along the bit line (CN) 30 and a cross-sectional view of at least a portion of the memory cell array 20 along the word line (WL) 28. The memory cells 12 of the memory cell array 20 may be implemented in a vertical configuration having various regions. For example, the memory cell 12 may comprise a first P− region 920, a second P− region 922, a third P− region 924, and/or an N+ region 926. The first P− region 920, the second P− region 922, the third P-region 924, and/or the N+ region 926 may be disposed in a sequential contiguous relationship, and may extend vertically from a plane defined by a P+ substrate 130. In an exemplary embodiment, the second P− region 922 may be an electrically floating body region of the memory cell 12 configured to accumulate/store charges, and may be spaced apart from and capacitively coupled to the plurality of word lines (WL) 28.

The first P− region 920 of the memory cell 12 may be coupled to the bit line (CN) 30. The second P− region 922 of the memory cell 12 may be capacitively coupled to the word line (WL) 28. The third P− region 924 of the memory cell 12 may be coupled to the source line (EN) 32. The N+ region 926 of the memory cell 12 may be coupled to a carrier injection line (EP) 34.

The first P− region 920, the second P− region 922, and the third P− region 924 may be formed of the same material or different materials. Also, the first P− region 920, the second P− region 922, and the third P− region 924 may be formed of the same material having various doping concentrations. In an exemplary embodiment, the first P− region 920, the second P− region 922, and the third P− region 924 may be formed of a semiconductor material (e.g., silicon) comprising acceptor impurities. For example, the first P− region 920, the second P− region 922, and/or the third P− region 924 may be formed of a silicon material doped with boron impurities. In an exemplary embodiment, the first P− region 920, the second P− region 922, and/or the third P− region 924 may be formed of a silicon material with acceptor impurities having a concentration of $10^{15}$ atoms/cm$^3$ to $10^{18}$ atoms/cm$^3$.

The N+ region 926 may be made in the form of an N-well region. In another exemplary embodiment, the N+ region 926 may be made of a semiconductor material (e.g., silicon) comprising donor impurities and may form a base of the one or more memory cells 12. For example, the N+ region 926 may form the base of a row or a column of memory cells 12 of the memory cell array 20. The N+ region 926 may comprise a continuous planar region configured above the P+ substrate 130. The N+ region 926 may also comprise a plurality of barrier walls formed on the continuous planar region. The plurality of barrier walls of the N+ region 926 may be oriented in a column direction and/or a row direction of the memory cell array 20.

The bit line (CN) 30 may be formed of at least one layer. In an exemplary embodiment, the bit line (CN) 30 may comprise a plurality of layers. For example, the first layer of the bit line (CN) 32 may be formed of a polysilicon material or silicon dioxide material, and/or a combination thereof. In another exemplary embodiment, the first layer of the bit line (CN) 30 may be formed of a semiconductor material (e.g., intrinsic silicon) comprising donor impurities. For example, the first layer of the bit line (CN) 30 may be formed of a silicon material doped with nitrogen, arsenic, and/or phosphorus impurities. In an exemplary embodiment, the first layer of the bit line (CN) 30 may be formed of a silicon material with donor impurities having a concentration of $10^{18}$ atoms/cm$^3$ or above. The second layer of the bit line (CN) 30 may be formed of a metal material, polysilicon material, silicon dioxide material, and/or a combination thereof. In an exemplary embodiment, the second layer of the bit line (CN) 30 may be formed of tungsten, titanium, titanium nitride, polysilicon or a combination thereof. For example, the bit line (CN) 30 may be coupled to a plurality of memory cells 12 (e.g., a column or a row of memory cells 12 of the memory cell array 20). The bit line (CN) 30 may be configured above the first P– region 920.

The word lines (WL) 28 may be capacitively coupled to the second P– region 922. The word lines (WL) 28 may be oriented in a row direction of the memory cell array 20 and coupled to a plurality of memory cells 12. The word lines (WL) 28 may be arranged on side portions of the memory cells 12 (e.g., memory cells 12 located on a row direction of the memory cell array 20). For example, the word lines (WL) 28 may be arranged at two side portions of the second P– region 922 of the memory cells 12.

For example, the word lines (WL) 28 may be formed of a polycide material (e.g., a combination of a metal material and a silicon material), a metal material, and/or a combination of a polycide material and a metal material. In another exemplary embodiment, the word lines (WL) 28 may be formed of an N+ doped silicon material. In an exemplary embodiment, the word lines (WL) 28 may capacitively couple a voltage potential/current source of the memory cell selection and control circuitry 38 to the second P– region 922 of the memory cell 12. In an exemplary embodiment, the first word line (WL) 28 may implement a write logic low (e.g., binary "0" data state) operation on the memory cell 12, while the second word line (WL) 28 may implement a write logic high (e.g., binary "1" data state) operation.

The source line (EN) 32 may be coupled to the third P– region 924 of the memory cell 12. The source line (EN) 32 may be formed of a metal material. In another exemplary embodiment, the source line (EN) 32 may be formed of a polycide material (e.g., a combination of a metal material and a silicon material). In other exemplary embodiments, the source line (EN) 32 may be formed of a P+ doped silicon layer. For example, the source line (EN) 32 may be coupled to a plurality of memory cells 12. The source line (EN) 32 may be configured on a side portion of the third P– region 924.

An oxide layer 128 may be formed on the N+ region 926 and/or the P+ substrate 130. For example, the oxide layer 128 may be formed of an insulating material. In an exemplary embodiment, the oxide layer 128 may be formed of an insulating oxide material. The oxide layer 128 may include a plurality of barrier walls formed of an insulating oxide material. The plurality of barrier walls may be oriented in a column direction and a row direction of the memory cell array 20. For example, a first barrier wall of the plurality of barrier walls may be oriented in a column direction. A second barrier wall of the plurality of barrier walls may be oriented in a row direction. The first barrier wall oriented in a column direction may have a different height from the second barrier wall oriented in a row direction. In an exemplary embodiment, the first barrier wall oriented in the column direction and the second barrier wall oriented in the row direction may intersect to form a trench region. The oxide layer 128 may form a trench region that may have a cross-sectional shape to accommodate one or more memory cells 12 therein. For example, the trench region may have a cross-sectional shape of a square, a rectangle, a cylinder, and/or other shapes that may accommodate one or more memory cells 12.

In an exemplary embodiment, the P+ substrate 130 may be made in the form of a P-well substrate. In another exemplary embodiment, the P+ substrate 130 may be made of a semiconductor material (e.g., silicon) comprising acceptor impurities and may form a base of the memory cell array 20. In alternative exemplary embodiments, a plurality of P+ substrates 130 may form the base of the memory cell array 20 or a single P+ substrate 130 may form the base of the memory cell array 20.

An insulating layer 132 may be formed on top of the first P– region 920. For example, the insulating layer 132 may be formed of an insulating material, oxide material, and/or dielectric material. In an exemplary embodiment, the insulating layer 132 may be formed of a silicon nitride material. The insulating layer 132 may be formed above the first P– region 920 to electrically insulating the bit line (CN) 30.

Figure 10:
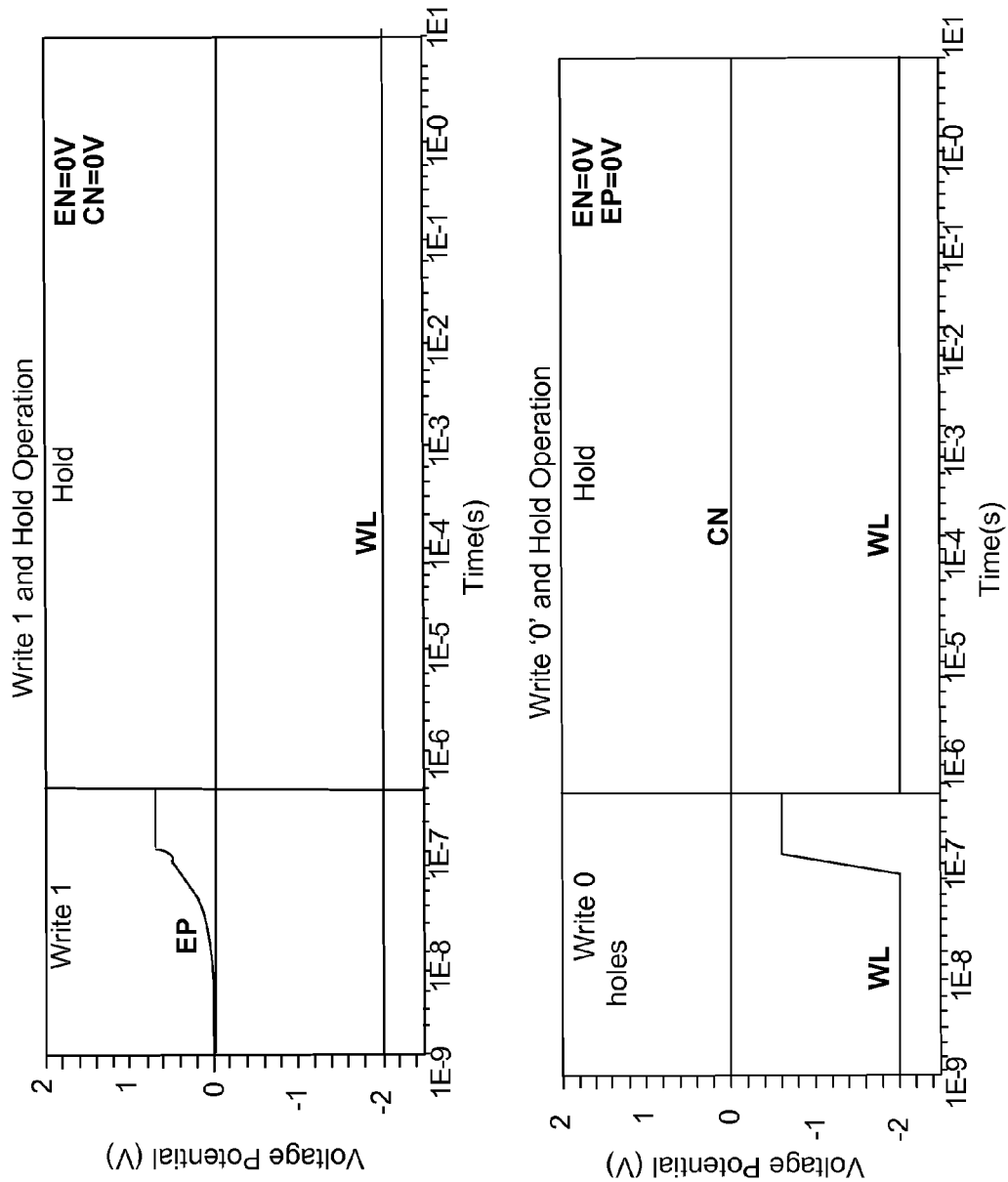
FIG. 10 shows control signal voltage waveforms for performing a write operation on a memory cell shown in FIG. 2 in accordance with an embodiment of the present disclosure.

Referring to FIG. 10, there are shown control signal voltage waveforms for performing a write operation on a memory cell 12 shown in FIG. 2 in accordance with an embodiment of the present disclosure. For example, the various control signals may be configured to perform a write logic low (e.g., binary "0" data state) operation, and/or a write logic high (e.g., binary "1" data state) operation. In an exemplary embodiment, various control signals may be applied to the memory cell 12 to perform one or more write logic low (e.g., binary "0" data state) operations to one or more selected memory cells 12. For example, the write logic low (e.g., binary "0" data state) operation may be performed to one or more selected memory cells 12 in order to deplete charge carriers that may have accumulated/stored in the floating body regions of the one or more selected memory cells 12. Various voltage potentials may be applied to the various regions of the memory cell 12. In an exemplary embodiment, the voltage potentials applied to the first N– region 120, the third N– region 124, and/or the P– region 126 may be maintained at 0V. The voltage potential applied to the word line (WL) 28 that may be capacitively coupled to the second N– region 122 may be raised from a voltage potential applied during the hold operation. In an exemplary embodiment, the voltage potential applied to the word line (WL) 28 that may be capacitively coupled to the second N– region 122 may be raised to –0.5V.

Under such biasing, the junction between the first N– region 120 and the second N– region 122 and the junction between the second N– region 122 and the third N– region 124 may be forward biased. The junction between the third N– region 124 and the P– region 126 may be reverse biased or weakly forward biased (e.g., above a reverse bias voltage and below a forward bias threshold voltage potential). The hole charge carriers that may have accumulated/stored in the second N– region 122 may flow to the first N– region 120 and/or the third N– region 124. Thus, the hole charge carriers that may have accumulated/stored in the second N– region 122 may be depleted via the first N– region 120 and/or the third N– region 124. By removing the hole charge carriers that may have accumulated/stored in the second N– region 122, a logic low (e.g., binary "0" data state) may be written to the memory cell 12.

After performing a write logic low (e.g., binary "0" data state) operation, the control signals may be configured to perform a hold operation in order to maintain a data state (e.g., a logic high (binary. "1" data state)) stored in the memory cell 12. In particular, the control signals may be configured to perform a hold operation in order to maximize a retention time of a data state (e.g., a logic low (binary "0" data state)) stored in the memory cell 12. Also, the control signals for the hold operation may be configured to eliminate or reduce activities or field (e.g., electrical fields between junctions which may lead to leakage of charges) within the memory cell 12. In an exemplary embodiment, during a hold operation, a negative voltage potential may be applied to the word line (WL) 28 that may be capacitively coupled to the second N– region 122 of the memory cell 12 while constant voltage potentials may be applied to the first N– region 120 via the source line (EN) 32, the third N– region 124 via the bit line (CN) 30, and/or the P– region 126 via the carrier injection line (EP) 34 may be maintained at 0V.

For example, the negative voltage potential applied to the word line (WL) 28 (e.g., capacitively coupled to the P– region 122 of the memory cell 12) may be –2.0V. During the hold operation, the junction between the first N– region 120 and the second N– region 122 and the junction between the third N– region 124 and the second N– region 122 may be reverse biased in order to retain a data state (e.g., a logic high (binary "1" data state) or a logic low (binary "0" data state)) stored it the memory cell 12.

In another exemplary embodiment, control signals may be configured to write a logic high (e.g., binary "1" data state) to one or more selected memory cells 12 of one or more selected rows of the memory cell array 20. For example, the write logic high (e.g., binary "1" data state) operation may be performed on one or more selected rows of the memory cell array 20 or the entire memory cell array 20. In another exemplary embodiment, a write logic high (e.g., binary "1" data state) operation may have control signals configured to cause accumulation/storage of hole charge carriers in the second N– region 122.

In an exemplary embodiment, a voltage potential applied to the first N– region 120 of the memory cell 12 via the source line (EN) 32 and a voltage potential applied to the third N– region 124 via the bit line (CN) 30 may be maintained at the same voltage potential as the voltage potential during the hold operation. For example, the voltage potential applied to first N– region 120 via the source line (EN) 32 and the third N– region 124 via the bit line (CN) 30 may be maintained at 0V. The voltage potential applied to the word line (WL) 28 that may be capacitively coupled to the second N– region 122 may be also maintained the same as during the hold operation. For example, the voltage potential applied to the word line (WL) 28 that may be capacitively coupled to the second N– region 122 may be maintained at –2.0V.

The voltage potential applied to the P– region 126 via the carrier injection line (EP) 34 may be raised from a voltage potential applied during the hold operation. In an exemplary embodiment, the voltage potential applied to the P– region 126 via the carrier injection line (EP) 34 may be raised to approximately 0.7V to 0.9V from 0V.

Under such biasing, the junction between the third N– region 124 and the P– region 126 may become forward biased. For example, the majority charge carriers (e.g., holes) may flow toward from the P– region 126 to the second N– region 122 via the third N– region 124. Thus, a predetermined amount of hole charge carriers may be accumulated/stored in the N– region 122 via the P+ region 126 and the third N– region 124. The predetermined amount of charge carriers accumulated/stored in the second N– region 122 (e.g., capacitively coupled to word line (WL) 28) may represent that a logic high (e.g., binary "1" data state) may be written in the memory cell 12.

Figure 11:
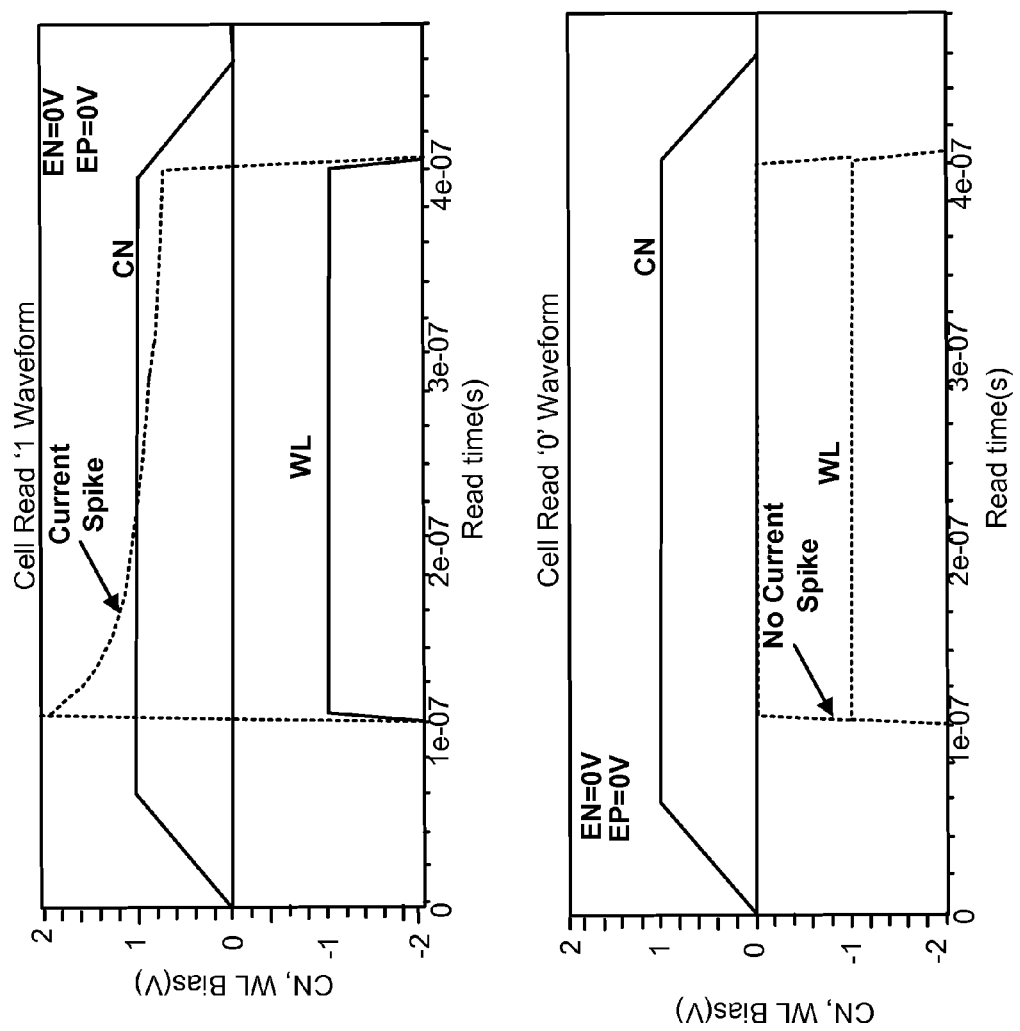
FIG. 11 shows control signal voltage waveforms for performing a read operation on a memory cell shown in FIG. 2 in accordance with an embodiment of the present disclosure.

Referring to FIG. 11, there are shown control signal voltage waveforms for performing a read operation on a memory cell 12 shown in FIG. 2 in accordance with an embodiment of the present disclosure. In an exemplary embodiment, control signals may be configured to perform a read operation of a data state (e.g., a logic low (binary "0" data state) and/or a logic high (binary "1" data state)) stored in one or more selected memory cells 12 of one or more selected rows of the memory cell array 20.

The control signals may be configured to a predetermined voltage potential to implement a read operation via the bit line (CN) 30. In an exemplary embodiment, the voltage potential applied to the first N– region 120 via the source line (EN) 32 and the voltage potential applied to the P– region 126 via the carrier injection line (EP) 34 may be maintained at 0V. The voltage potential applied to the word line (WL) 28 that may be capacitively coupled to the second N– region 122 and the voltage potential applied to the third N– region 124 may be raised from the voltage potentials applied during the hold operation. In an exemplary embodiment, the voltage potential applied to the word line (WL) 28 that may be capacitively coupled to the second N– region 122 may be raised to –1.0V from –2.0V. The voltage potential applied to the third N– region 124 via the bit line (CN) 30 may be raised to 1.0V from 0V.

Under such biasing, when a logic low (e.g., binary "0" data state) is stored in the memory cell 12, the predetermined amount of hole charge carriers accumulated/stored in the second N– region 122 during hold operation may flow toward the third N– region 124. The predetermined amount of hole charge carriers flown to the third N– region 124 may cause an injection of electron charge carriers from the third N– region 124. The injection of electron charge carriers from the third N– region 124 may cause a current spike and may change a voltage potential on the bit line (CN) 30. A data sense amplifier in the data write and sense circuitry 36 may detect the small amount of voltage potential or current (e.g., compared to a reference voltage potential or current) or no voltage potential or current via the bit line (CN) 30 coupled to the third N– region 124.

When a logic high (e.g., binary "1" data state) is stored in the memory cell 12, the predetermined amount of hole charge carriers (e.g., that may represent a logic high (e.g., binary "1" data state)) accumulated/stored in the second N– region 122 may flow toward the third N– region 124. The predetermined amount of hole charge carriers injected into the third N– region 124 may also cause an injection of electron charge carriers into the third N– region 124. The injection of electron charge carriers into the third N– region 124 may cause a current spike and may change a voltage potential on the bit line (CN) 30. A data sense amplifier in the data write and sense circuitry 36 may detect the generated voltage potential or current (e.g., compared to a reference voltage potential or current) via the bit line (CN) 30.

At this point it should be noted that providing techniques for providing a semiconductor memory device in accordance with the present disclosure as described above typically involves the processing of input data and the generation of output data to some extent. This input data processing and output data generation may be implemented in hardware or software. For example, specific electronic components may be employed in a semiconductor memory device or similar or related circuitry for implementing the functions associated with providing a semiconductor memory device in accordance with the present disclosure as described above. Alternatively, one or more processors operating in accordance with instructions may implement the functions associated with providing a semiconductor memory device in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for biasing a semiconductor memory device comprising the steps of:
    applying a first voltage potential to a first region of a first memory cell in an array of memory cells via a respective source line of the array;
    applying a second voltage potential to a second region of the first memory cell via a respective bit line of the array;
    applying a third voltage potential to a body region of the first memory cell via at least one respective word line of the array that is capacitively coupled to the body region; and
    applying a fourth voltage potential to a third region of the first memory cell via a respective carrier injection line of the array;
    wherein the first region, the second region, and the body region have a common first doping polarity.

2. The method according to claim 1, further comprising increasing the third voltage potential applied to the at least one respective word line during a hold operation in order to perform a write logic low operation.

3. The method according to claim 1, further comprising maintaining the first voltage potential, the second voltage potential, and the fourth voltage potential applied during a hold operation in order to perform a write logic low operation.

4. The method according to claim 1, further comprising increasing the fourth voltage potential applied during a hold operation in order to perform a write logic high operation.

5. The method according to claim 1, further comprising maintaining the first voltage potential, the second voltage potential, and the third voltage potential applied during a hold operation in order to perform a write logic high operation.

6. The method according to claim 1, further comprising increasing the second voltage potential applied during a hold operation in order to perform a read operation.

7. The method according to claim 1, further comprising increasing the third voltage potential applied during a hold operation in order to perform a read operation.

8. The method according to claim 1, wherein the body region is disposed between the first region and the second region.

9. The method according to claim 1, wherein the first region, the second region, and the body region have different doping concentrations.

10. The method according to claim 1, wherein the third region has a second doping polarity that is different from the first doping polarity.

11. The method according to claim 10, wherein the first region, the second region, and the body region are doped with donor impurities.

12. The method according to claim 11, wherein the third region is doped with acceptor impurities.

13. The method according to claim 10, wherein the first region, the second region, and the body region are doped with acceptor impurities.

14. The method according to claim 13, wherein the third region is doped with donor impurities.

15. The method according to claim 1, wherein the first region, the second region, and the body region are undoped regions.

16. The method according to claim 1, wherein the first region, the second region, the body region, and the third region are arranged in a planar configuration.

17. The method according to claim 1, wherein the first region, the second region, the body region, and the third region are arranged in a vertical configuration.

18. The method according to claim 17, wherein the source line and the bit line are arranged on opposite sides of the memory cell.

19. The method according to claim 17, wherein the word line is arranged on at least two opposing sides of the memory cell.

* * * * *